US011521045B2

(12) United States Patent
Nugent

(10) Patent No.: US 11,521,045 B2
(45) Date of Patent: Dec. 6, 2022

(54) ANTI-HEBBIAN AND HEBBIAN (AHAH) COMPUTING

(71) Applicant: Alex Nugent, Santa Fe, NM (US)

(72) Inventor: Alex Nugent, Santa Fe, NM (US)

(73) Assignee: Knowm, Inc., Santa Fe, NM (US)

( * ) Notice: Subject to any disclaimer, the term of this patent is extended or adjusted under 35 U.S.C. 154(b) by 1086 days.

(21) Appl. No.: 16/000,161

(22) Filed: Jun. 5, 2018

(65) Prior Publication Data

US 2022/0351045 A1    Nov. 3, 2022

Related U.S. Application Data

(60) Provisional application No. 62/519,355, filed on Jun. 14, 2017.

(51) Int. Cl.
| | |
|---|---|
| *G06N 3/063* | (2006.01) |
| *G06N 3/08* | (2006.01) |
| *G06N 20/00* | (2019.01) |
| *G06N 3/02* | (2006.01) |
| *G06N 3/04* | (2006.01) |
| *G11C 11/54* | (2006.01) |

(52) U.S. Cl.
CPC ............. *G06N 3/063* (2013.01); *G06N 3/02* (2013.01); *G06N 3/04* (2013.01); *G06N 3/049* (2013.01); *G06N 3/0472* (2013.01); *G06N 3/0635* (2013.01); *G06N 3/08* (2013.01); *G06N 3/084* (2013.01); *G06N 20/00* (2019.01); *G11C 11/54* (2013.01)

(58) Field of Classification Search
CPC ..................................................... G11C 11/54
See application file for complete search history.

(56) References Cited

U.S. PATENT DOCUMENTS

| | | | |
|---|---|---|---|
| 6,889,216 | B2 | 5/2005 | Nugent |
| 6,995,649 | B2 | 2/2006 | Nugent |
| 7,028,017 | B2 | 4/2006 | Nugent |
| 7,039,619 | B2 | 5/2006 | Nugent |
| 7,107,252 | B2 | 9/2006 | Nugent |

(Continued)

OTHER PUBLICATIONS

Nugent et al., "Cortical Processing with Thermodynamic-RAM," in arXiv preprint arXiv:1408.3215 (2014). (Year: 2014).*

(Continued)

*Primary Examiner* — Kamran Afshar
*Assistant Examiner* — Ryan C Vaughn
(74) *Attorney, Agent, or Firm* — Ortiz & Lopez, PLLC; Kermit D. Lopez; Luis M. Ortiz

(57) ABSTRACT

Methods, systems and devices for unsupervised learning utilizing at least one kT-RAM. An evaluation can be performed over a group of N AHaH nodes on a spike pattern using a read instruction (FF), and then an increment high (RH) instruction can be applied to the most positive AHaH node among the N AHaH nodes if an ID associated with the most positive AHaH node is not contained in a set, followed by adding a node ID to the set. In addition, an increment low (RL) instruction can be applied to all AHaH nodes that evaluated positive but were not the most positive, contingent on the most-positive AHaH node's ID not being contained in the set. In addition, node ID's can be removed from the set if the set size is equal to the N number of AHaH nodes.

18 Claims, 4 Drawing Sheets

(56) References Cited

U.S. PATENT DOCUMENTS

| | | |
|---|---|---|
| 7,249,116 B2 | 7/2007 | Fiske |
| 7,392,230 B2 | 6/2008 | Nugent |
| 7,398,259 B2 | 7/2008 | Nugent |
| 7,409,375 B2 | 8/2008 | Nugent |
| 7,412,428 B2 | 8/2008 | Nugent |
| 7,420,396 B2 | 9/2008 | Nugent |
| 7,426,501 B2 | 9/2008 | Nugent |
| 7,502,769 B2 | 3/2009 | Nugent |
| 7,599,895 B2 | 10/2009 | Nugent |
| 7,752,151 B2 | 7/2010 | Nugent |
| 7,792,770 B1 | 9/2010 | Phoha et al. |
| 7,827,130 B2 | 11/2010 | Nugent |
| 7,827,131 B2 | 11/2010 | Nugent |
| 7,930,257 B2 | 4/2011 | Nugent |
| 8,022,732 B2 | 9/2011 | Nugent |
| 8,041,653 B2 | 10/2011 | Nugent |
| 8,156,057 B2 | 4/2012 | Nugent |
| 8,311,958 B2 | 11/2012 | Nugent |
| 8,332,339 B2 | 12/2012 | Nugent |
| 8,452,718 B2 | 5/2013 | Jin et al. |
| 8,781,983 B2 | 7/2014 | Nugent |
| 8,818,910 B1 | 8/2014 | Liu et al. |
| 8,909,580 B2 | 12/2014 | Nugent |
| 8,918,353 B2 | 12/2014 | Nugent |
| 8,972,316 B2 | 3/2015 | Nugent |
| 8,983,886 B2 | 3/2015 | Nugent |
| 8,990,136 B2 | 3/2015 | Nugent |
| 9,099,179 B2 | 8/2015 | Nugent |
| 9,104,975 B2 | 8/2015 | Nugent |
| 9,152,917 B2 | 10/2015 | Nugent |
| 9,171,264 B2 | 10/2015 | Finocchio et al. |
| 9,269,043 B2 | 2/2016 | Nugent |
| 9,275,347 B1 | 3/2016 | Harada et al. |
| 9,280,748 B2 | 3/2016 | Nugent |
| 9,324,022 B2 | 4/2016 | Williams, Jr. et al. |
| 9,336,249 B2 | 5/2016 | Ray et al. |
| 9,373,087 B2 | 6/2016 | Nowozin |
| 9,460,401 B2 | 10/2016 | Zeng et al. |
| 9,535,960 B2 | 1/2017 | Guo et al. |
| 9,547,821 B1 | 1/2017 | Loreggia et al. |
| 9,565,370 B2 | 2/2017 | Hubei et al. |
| 9,582,770 B2 | 2/2017 | Zeng |
| 9,589,005 B2 | 3/2017 | Dedeoglu |
| 9,589,210 B1 | 3/2017 | Estrada et al. |
| 9,589,238 B2 | 3/2017 | Nugent |
| 9,600,762 B2 | 3/2017 | Sarah et al. |
| 9,600,779 B2 | 3/2017 | Hoover et al. |
| 9,602,783 B2 | 3/2017 | Sugishita et al. |
| 2003/0177450 A1 | 9/2003 | Nugent |
| 2003/0236760 A1 | 12/2003 | Nugent |
| 2004/0039717 A1 | 2/2004 | Nugent |
| 2004/0153426 A1 | 8/2004 | Nugent |
| 2004/0162796 A1 | 8/2004 | Nugent |
| 2004/0193558 A1 | 9/2004 | Nugent |
| 2005/0015351 A1 | 1/2005 | Nugent |
| 2005/0149464 A1 | 7/2005 | Nugent |
| 2005/0149465 A1 | 7/2005 | Nugent |
| 2005/0151615 A1 | 7/2005 | Nugent |
| 2005/0256816 A1 | 11/2005 | Nugent |
| 2006/0036559 A1 | 2/2006 | Nugent |
| 2006/0184466 A1 | 8/2006 | Nugent |
| 2007/0005532 A1 | 1/2007 | Nugent |
| 2007/0022064 A1 | 1/2007 | Nugent |
| 2007/0176643 A1 | 8/2007 | Nugent |
| 2008/0258773 A1 | 10/2008 | Nugent |
| 2009/0043722 A1 | 2/2009 | Nugent |
| 2009/0138419 A1 | 5/2009 | Nugent |
| 2009/0228415 A1 | 9/2009 | Nugent |
| 2009/0228416 A1 | 9/2009 | Nugent |
| 2010/0280982 A1 | 11/2010 | Nugent |
| 2010/0287124 A1 | 11/2010 | Nugent |
| 2011/0145177 A1 | 6/2011 | Nugent |
| 2011/0145179 A1 | 6/2011 | Nugent |
| 2011/0161268 A1 | 6/2011 | Nugent |
| 2011/0302119 A1 | 12/2011 | Nugent |
| 2012/0078827 A1 | 3/2012 | Nugent |
| 2012/0150780 A1 | 6/2012 | Nugent |
| 2012/0175583 A1 | 7/2012 | Nugent |
| 2012/0191438 A1 | 7/2012 | Nugent |
| 2013/0073491 A1* | 3/2013 | Izhikevich ............ G06N 3/049 706/15 |
| 2013/0218815 A1 | 8/2013 | Nugent |
| 2013/0258905 A1 | 10/2013 | Nugent |
| 2013/0275358 A1 | 10/2013 | Nugent |
| 2013/0289902 A1 | 10/2013 | Nugent |
| 2014/0006323 A1 | 1/2014 | Nugent |
| 2014/0156576 A1 | 6/2014 | Nugent |
| 2014/0192587 A1 | 7/2014 | Nugent |
| 2015/0019467 A1 | 1/2015 | Nugent |
| 2015/0019468 A1 | 1/2015 | Nugent et al. |
| 2015/0074029 A1 | 3/2015 | Nugent et al. |
| 2015/0112182 A1 | 4/2015 | Sharma et al. |
| 2015/0127590 A1 | 5/2015 | Gay et al. |
| 2015/0170050 A1 | 6/2015 | Price |
| 2015/0196265 A1 | 7/2015 | Suzuki |
| 2015/0262075 A1 | 9/2015 | Nugent |
| 2015/0269485 A1 | 9/2015 | Julian et al. |
| 2015/0286926 A1 | 10/2015 | Nugent |
| 2015/0347899 A1 | 12/2015 | Nugent et al. |
| 2016/0004959 A1 | 1/2016 | Nugent |
| 2016/0034814 A1 | 2/2016 | Audhkhasi et al. |
| 2016/0148091 A1 | 5/2016 | Nugent et al. |
| 2016/0232128 A1 | 8/2016 | Rivera et al. |
| 2016/0259994 A1 | 9/2016 | Ravindran et al. |
| 2016/0260028 A1 | 9/2016 | Nugent |
| 2016/0332298 A1* | 11/2016 | Garrod ................ G05D 1/0088 |
| 2016/0379137 A1 | 12/2016 | Burger et al. |
| 2017/0017875 A1 | 1/2017 | Modha |
| 2017/0024849 A1 | 1/2017 | Liu et al. |
| 2017/0031329 A1 | 2/2017 | Inagaki et al. |
| 2017/0061249 A1 | 3/2017 | Estrada et al. |
| 2017/0068883 A1 | 3/2017 | Modha |
| 2017/0071562 A1 | 3/2017 | Suzuki |
| 2017/0076143 A1 | 3/2017 | Sapiro et al. |
| 2017/0083772 A1 | 3/2017 | Kim et al. |
| 2017/0090428 A1 | 3/2017 | Oohara |
| 2017/0091614 A1 | 3/2017 | Amir et al. |
| 2017/0098172 A1 | 4/2017 | Ellenbogen et al. |

OTHER PUBLICATIONS

Nugent et al., "AHaH Computing—From Metastable Switches to Attractors to Machine Learning," in 9.2 PLoS One e85175 (2014). (Year: 2014).*

Nugent, "AHaH Computing with Thermodynamic RAM: Bridging the Technology Stack," in 9119 Machine Intelligence and Bio-Inspired Computation: Theory and Applications VIII 911905 (2014). (Year: 2014).*

Zhou, Z.-H. et al., Deep Forest: Towards an Alternative to Deep Neural Networks, arXiv:1702.08835, 7 pages.

Chandola, V. et al., Anomaly Detection : A Survey, ACM Computing Surveys Sep. 2009, 72 pages.

Bengio, Y. et al., Decision Trees do not Generalize to New Variations, Computational Intelligence (2010) 26 (4):449-467.

Bengio, Y. et al., On the Expressive Power of Deep Architectures, Proceedings of the 22nd International Conference on Algorithmic Learning Theory (2011) Espoo, Finland, Oct. 5-7, pp. 18-36.

Binas, J. et al., Precise deep neural network computation on imprecise low-power analog hardware, arXiv:1606.07786, 21 pages.

Chua, L. O., Memristor-The Missing Circuit Element, IEEE Transactions on Circuit Theory (1971) CT-18(5):507-519.

Hamdioui, S. et al., Memristor Based Computation-in-Memory Architecture for Data-lntensive Applications, Design, Automation & Test in Europe Conference & Exhibition (DATE) Mar. 9-13, 2015, 8 pages.

Kontschieder, P. et al., Deep Neural Decision Forests, IEEE International Conference on Computer Vision (IVVC) Dec. 7-13, 2015, pp. 1467-1475.

Kotsiantis, S. B., Supervised Machine Learning: A Review of Classification Techniques, Informatica (2007) 31:249-268.3.

(56) References Cited

OTHER PUBLICATIONS

Cutler, A., Random Forests for Regression and Classification, Utah State University, Sep. 15-17, 2010, Ovronnaz, Switzerland, 129 pages.
Saligrama, V. et al., Video Anomaly Identification A statistical approach, IEEE Signal Processing Sep. 2010, pp. 18-33.
Thottan, M. et al., Anomaly Detection in IP Networks, IEEE Transactions on Signal Processing (2003) 51 (8):2191-2204.
Soudry, D. et al., Memristor-Based Multilayer Neural Networks with Online Gradient Descent Training, IEEE Transactions on Neural Networks and Learning Systems (2015) 14 pages.
Tong, W. et al., Decision Forest: Combining the Predictions of Multiple Independent Decision Tree Models, J. Chem. Inf. Comput. Sci (2003) 43:525-531.
Di Ventra, M. et al., Circuit elements with memory: memristors, memcapicators and meminductors, Proceedings of the IEEE (2009) 97(10):1717-1724.
Wu, X. et al., Top 10 algorithms in data mining, Konwl Inf. Syst. (2008) 14:1-37.

\* cited by examiner

ANTI-HEBBIAN AND HEBBIAN (AHAH) COMPUTING

CROSS-REFERENCE TO PROVISIONAL APPLICATION

This patent application claims priority under 35 U.S.C. § 119(e) to U.S. Provisional Patent Application Ser. No. 62/519,355, which was filed on Jun. 14, 2017, the disclosure of which is incorporated herein by reference in its entirety.

GOVERNMENT RIGHTS

This invention was made with Government support under Contract No.: FA8750-16-C-0183 awarded by the United States Air Force Research Laboratory. The Government of the United States of America has certain rights in this invention.

TECHNICAL FIELD

Embodiments are generally related to fields of AI (Artificial Intelligence), machine learning and neuromorphic electronics. Embodiments are further related to the execution of instruction set sequences on thermodynamic RAM to accomplish various machine learning objectives. Embodiments also relate to AHAH (Anti-Hebbian and Hebbian) computing devices, systems and applications. Embodiments further relate to kT-RAM or thermodynamic-RAM (Random Access Memory).

BACKGROUND

AI (Artificial Intelligence) deals with the science of making machines intelligent. Machine intelligence is a catalyzing technology with world-changing consequences. Intelligence is defined as "the ability to acquire and apply knowledge and skills." Intelligence is intimately related to (or is) learning. Learning can be interpreted from an information or computer-science perspective, which focuses on the algorithms used to adjust parameters that encode the knowledge acquired during the learning process. This approach has yielded useful algorithms. Learning can also be interpreted from a physics-based (physical) perspective, which leads to insight regarding the implementation of machine intelligence at high Space, Weight and Power (SWaP) efficiencies. Both interpretations are important for the realization of powerful artificial intelligence.

It takes energy to move data around. In integrated circuits we can move data with electrons on metal wires or, more recently, with photons in waveguides. Photons are optimal for long-distance communication but they fail for short-distance communication. We cannot compute directly with photons because they do not interact, so we must couple them to material that can interact, namely, electrons. It takes energy and space (the circuit) to convert from electrons to photons and back again. The result of this is that optical communication does not help if we do not need to communicate information far before we use it in another computation. This is the case with algorithms such as neural networks or emulations of biological nervous systems.

One common argument against computing architectures which aim to circumvent the von Neumann Bottleneck such as quantum computing and physical neural networks, is that Moore's Law will continue uninterrupted and computers will be fast enough to accelerate any algorithm. This argument is typically used by those with a strictly information or computer science background. The argument is invalid for the physical reasons that the universe is constructed of atoms, and consequently there is a limit to size scaling. No matter what the scale, the core problem limiting the realization of SWaP-efficient intelligence machines is the separation of memory and processing.

While the separation of memory and processing is a design constraint of human computing technology, it does not occur anywhere in Nature including the human brain (and all life). The effects of this constraint can be illustrated with a thought experiment.

Suppose we were to simulate the human body at a moderate fidelity such that each cell of the body was allocated to one processor-memory (CPU+RAM) sub-system (core), and the distance between memory and processor was d. We ask: How much energy would be consumed in just the communication between the memory and processor? Each cell is simulated as a collection of state variables, and these variables are encoded as bits in the RAM of each core. Through an iterative process, data move from RAM to CPU where updates to the state variables are computed and put back in RAM. The more detailed our simulation, the more state variables we need. On one end of the simulation spectrum we could simulate the position, velocity and configuration of every molecule. On the other end we could only encode if it is alive or dead.

The aforementioned aspects and other objectives and advantages can now be achieved as described herein. A method, system and apparatus for unsupervised learning utilizing at least one kT-RAM can be implemented. An evaluation can be performed over a plurality of N AHaH nodes on a spike pattern using a read instruction (FF), and then an increment high (RH) feedback instruction can be applied to the most positive AHaH node among the N AHaH nodes if an identifier (ID) associated with the most positive AHaH node is not contained in a set, followed by adding a node ID to the set. In addition, an increment low (RL) instruction can be applied to all AHaH nodes that evaluated positive but were not the most positive, contingent on the most-positive AHaH node's ID not being contained in the set. In addition, node ID's are removed from the set if the set size is equal to N, the number of AHaH nodes. In some example embodiments, all node ID's are removed from the set if the total number of evaluations exceeds a threshold number of evaluations.

The energy to charge a metal wire goes as $CV^2/2$, where C is the capacitance of the wire and V is the voltage. The capacitance of a wire is proportional to length. The longer it is, the more charge it can soak up. A typical dense wire capacitance in CMOS is 0.2 fF/um. Modern CPU and RAM are separated by about 1 centimeter (0.01 m) and the operating voltage is about 1 Volt. Using the above numbers, we could calculate how much energy would be dissipated in communication between the CPU and processors of all the cores in the super computer.

If we hypothetically set the voltage to V=0.025 Volts and the CPU-memory distance to the diameter of an average cell, $d=10^{-5}$ m, the simulation would consume a roughly hundred million Watts. The main take away message is that when you compare biology's power and space efficiency to a simulated exercise on von Neumann architecture, there is a many orders of magnitude difference. After the numbers are run, it should still be clear that to build such a capable computer is not possible on architectures where processor and memory are separate. There simply exists a barrier governed by simple Physics: communication requires time and power. The way around it is to remove the communication, and the only way currently known to do that is to merge memory and processing like biology has done. While computing architectures separating memory and processor have without a doubt been one of the greatest tools humans have ever built and will continue to be more and more capable, it introduces fundamental limitations in our ability to build large-scale adaptive systems at practical power efficiencies. There therefore exists a need for innovations that allow us to build large-scale learning systems that unify memory and processing.

A promising emerging technology that could find application in uniting memory and processing is the "memristor". In contrast to a linear or nonlinear resistor the memristor has a dynamic relationship between current and voltage including a memory of past voltages or currents. While a great deal of controversy has been generated in regards to the formal definition of a memristor, the key property of use to circuits is that it is a two-terminal variable resistance device that changes resistance as a function of the applied voltage or current. If a periodic voltage is applied a two-terminal device and the current is plotted as a function of voltage, the device is deemed a memristor if the resulting plot forms a pinched hysteresis loop.

Resistive memory devices are useful in hardware circuits since they can be used to represent tunable synaptic weights. Given this, it is clear that other types of devices could be used for this purpose if they possess a memory that alters the devices' electrical impedance. One example of this would be a variable capacitive device that changes its capacitance as a function of applied voltage or current history. These are termed "memcapacitors". Another example would be an chemically mediated device that stores energy as a battery does and that changes its electrical impedance as a function of applied voltage or current history. Such a device could be used as the basis of a state-holding element that can directly configure a circuit, and thus be used to unite memory and processing. We will call all such devices capable of altering their electrical impedance as a function of the history of applied voltage or current a "mempedance element".

Many memristive (conductance changing) materials have recently been reported, each with its own operating physics, and the trend continues. While the specific physical mechanisms underlying variable conductance differ among materials, the meta-stable-switch (MSS) framework can be used to represent the collective behavior and thus serves as unifying theoretical description of all memristors. The MSS framework generalizes memristive materials as collections of stochastic voltage-dependent conducting channels that switch between conducting states with a probability dependent on voltage, temperature, and adaptation threshold voltages, which in turn may be a function of temperature and prior device history. The MSS framework enables a mathematic description of memristive materials, from stochastic to deterministic, binary to multi-state.

Memristors can be categorized into types depending on how they respond to voltages.

Non-Polar: Application of both positive and negative voltage bias induces only increase or only decrease in conductance. Thermodynamic decay is used to change the conductance in the other direction. Examples include the dielectrophoretic aggregation of conductive nanoparticles in colloidal suspension.

Polar: Application of voltage bias enables incremental conductance in one direction, but all-or-nothing change in the opposite direction. An example of this includes phase-change memory.

Bi-Polar: Application of positive and negative voltage bias enables incremental conductance increase and decrease. An example of this includes Self Directed Channel (SDC) memristors.

All of these devices can be modeled with the MSS framework through suitable choice of state transfer functions that govern the probability that a meta-stable switch transitions from one state to another as a function of voltage and temperature.

A central processing unit (CPU) is the electronic circuitry within a computer that carries out the instructions of a computer program by performing the basic arithmetic, logical, control and input/output (I/O) operations specified by the instructions. The term "CPU" refers to a processor, more specifically to its processing unit and control unit (CU), distinguishing these core elements of a computer from external components such as main memory and I/O circuitry. The form, design and implementation of CPUs have changed over the course of their history, but their fundamental operation remains almost unchanged. Principal components of a CPU include the arithmetic logic unit (ALU) that performs arithmetic and logic operations, processor registers that supply operands to the ALU and store the results of ALU operations, and a control unit that orchestrates the fetching (from memory) and execution of instructions by directing the coordinated operations of the ALU, registers and other components.

Most modern CPUs are microprocessors, meaning they are contained on a single integrated circuit (IC) chip. An IC that contains a CPU may also contain memory, peripheral interfaces, and other components of a computer; such integrated devices are variously called microcontrollers or systems on a chip (SoC). Some computers employ a multi-core processor, which is a single chip containing two or more CPUs called "cores".

Array processors or vector processors have multiple processors that operate in parallel, with no unit considered central. A vector processor or array processor is a central processing unit (CPU) that implements an instruction set containing instructions that operate on one-dimensional arrays of data called vectors, compared to scalar processors, whose instructions operate on single data items. Vector processors can greatly improve performance on certain workloads, notably numerical simulation and similar tasks.

Most commodity CPUs implement architectures that feature instructions for a form of vector processing on multiple (vectorized) data sets, typically known as SIMD (Single Instruction, Multiple Data). Vector processing techniques also operate in video-game console hardware and in graphics accelerators such as GPUs (Graphics Processing Units).

GPUs are efficient at manipulating computer graphics and image processing, and their highly parallel structure makes them more efficient than general-purpose CPUs for algorithms where the processing of large blocks of data is done in parallel. In a personal computer, a GPU can be present on a video card, or it can be embedded on the motherboard or—in certain CPUs—on the CPU die.

It is becoming common to use a general purpose graphics processing unit (GPGPU) as a modified form of stream processor (or a vector processor), running compute kernels. This concept turns the computational power of a modern graphics accelerator's shader pipeline into general-purpose computing power, as opposed to being hard wired solely to do graphical operations. In certain applications requiring massive vector operations, this can yield higher performance than a conventional CPU.

CPU designs may include some multiple instructions for vector processing on multiple (vectorized) data sets, typically known as MIMD (Multiple Instruction, Multiple Data). Such designs are usually dedicated to a particular application and not commonly marketed for general-purpose computing.

For the purpose of this disclosure, we refer to a digital microprocessor as inclusive to CPUs, GPUs, GPGPUs, Vector Processors, Stream Processors or any other digital computing architecture that performs logical operations over bits in one or more memory spaces.

A transistor is a semiconductor device used to amplify or switch electronic signals and electrical power. It is composed of semiconductor material usually with at least three terminals for connection to an external circuit. A voltage or current applied to one pair of the transistor's terminals changes the current through another pair of terminals. Because the controlled (output) power can be higher than the controlling (input) power, a transistor can amplify a signal. Today, some transistors are packaged individually, but many more are found embedded in integrated circuits and form the foundational unit of digital microprocessors.

The metal-oxide-semiconductor field-effect transistor (MOSFET, MOS-FET, or MOS FET) is a type of transistor used for amplifying or switching electronic signals. Although the MOSFET is a four-terminal device with source (S), gate (G), drain (D), and body (B) terminals, the body (or substrate) of the MOSFET is often connected to the source terminal, making it a three-terminal device like other field-effect transistors. Because these two terminals are normally connected to each other (short-circuited), only three terminals appear in electrical diagrams.

The basic principle of the field-effect transistor was first explored by Julius Edgar Lilienfeld in 1925. The main advantage of a MOSFET over other types of transistors is that it requires very little current to turn on (e.g., less than 1 mA), while delivering a much higher current to a load (e.g., 10 to 50A or more).

In enhancement mode MOSFETs, a voltage drop across the oxide induces a conducting channel between the source and drain contacts via the field effect. The term "enhancement mode" refers to the increase of conductivity with increase in oxide field that adds carriers to the channel, also referred to as the inversion layer. The channel can contain electrons (called an nMOSFET or nMOS), or holes (called a pMOSFET or pMOS), opposite in type to the substrate, so nMOS is made with a p-type substrate, and pMOS with an n-type substrate. In the less common depletion mode MOSFET, detailed later on, the channel consists of carriers in a surface impurity layer of opposite type to the substrate, and conductivity is decreased by application of a field that depletes carriers from this surface layer.

The "metal" in the name MOSFET is now often a misnomer because the previously metal gate material is now often a layer of polysilicon (polycrystalline silicon). Aluminum had been the gate material until the mid-1970s, when polysilicon became dominant, due to its capability to form self-aligned gates. Metallic gates are regaining popularity, since it is difficult to increase the speed of operation of transistors without metal gates. Likewise, the "oxide" in the name can be a misnomer, as different dielectric materials are used with the aim of obtaining strong channels with smaller applied voltages.

An insulated-gate field-effect transistor or IGFET is a related term almost synonymous with MOSFET. The term may be more inclusive, since many "MOSFETs" use a gate that is not metal, and a gate insulator that is not oxide. Another synonym is MISFET for metal-insulator-semiconductor FET. The MOSFET is by far the most common transistor in both digital and analog circuits, though the bipolar junction transistor was at one time much more common.

Complementary metal-oxide-semiconductor (CMOS) is a technology for constructing integrated circuits. CMOS technology is used in microprocessors, microcontrollers, static RAM, and other digital logic circuits. CMOS technology is also used for several analog circuits such as image sensors, data converters, and highly integrated transceivers for many types of communication. CMOS is also sometimes referred to as complementary-symmetry metal-oxide-semiconductor. The words "complementary-symmetry" refer to the fact that the typical design style with CMOS uses complementary and symmetrical pairs of p-type and n-type metal oxide semiconductor field effect transistors (MOSFETs) for logic functions.

Two important characteristics of CMOS devices are high noise immunity and low static power consumption. Since one transistor of the pair is always off, the series combination draws significant power only momentarily during switching between on and off states. Consequently, CMOS devices do not produce as much waste heat as other forms of logic, for example transistor-transistor logic (TTL) or NMOS logic, which normally have some standing current even when not changing state. CMOS also allows a high density of logic functions on a chip. It was primarily for this reason that CMOS became the most used technology to be implemented in VLSI chips.

Machine learning applications span a very diverse landscape. Some areas include motor control, combinatorial search and optimization, clustering, prediction, anomaly detection, classification, regression, natural language processing, planning and inference. A common thread is that a system learns the patterns and structure of the data in its environment, builds a model, and uses that model to make predictions of subsequent events and take action. The models that emerge can contain hundreds to trillions of continuously adaptive parameters. Human brains contain on the order of $10^{15}$ adaptive synapses. How the adaptive weights are exactly implemented in an algorithm varies, and established methods include support vector machines, decision trees, artificial neural networks and deep learning, to name a few.

Intuition tells us learning and modeling the environment is a valid approach in general, as the biological brain also appears to operate in this manner. The unfortunate limitation with the algorithmic approach, however, is that it runs on traditional digital hardware. In such a computer, calculations and memory updates must necessarily be performed in different physical locations, often separated by a significant distance. The power required to adapt parameters grows impractically large as the number of parameters increases owing to the tremendous energy consumed shuttling digital bits back and forth. In a biological brain (and all of nature), the processor and memory are the same physical substrate and many computations and memory adaptations are performed in parallel.

Recent progress has been made with multi-core processors and specialized parallel processing hardware like GP-GPUs, and FPGAs, but for machine learning applications that intend to achieve the ultra-low power dissipation of biological nervous systems, it is a dead end approach. The low-power solution to machine learning occurs when the memory-processor distance goes to zero, and this can only be achieved through intrinsically adaptive hardware, such as memristors.

When multiple conduction pathways compete to dissipate energy through an adaptive container, the container will adapt in a particular way that leads to the maximization of energy dissipation. This mechanism is referred as Anti-Hebbian and Hebbian (AHaH) plasticity. It is computationally universal, but perhaps more importantly and interestingly, it can also lead to general-purpose solutions in machine learning. Because the AHaH rule describes a physical process, we can create efficient and dense analog AHaH synaptic circuits with memristive components. One version of these mixed signal (digital and analog) circuits forms a generic adaptive computing resource referred to as Thermodynamic Random Access Memory or Thermodynamic-RAM.

In neural systems, the algorithm can be specified by two features: the network topology and the plasticity of the interconnections or synapses. Any neural processor must contend with the problem that hard-wired neural topology will restrict the available neural algorithms that can be run on the processor. It is also crucial that the NPU interface merge easily with modern methods of computing. A 'Random Access Synapse' structure satisfies these constraints.

Thermodynamic-RAM (kT-RAM or KT-RAM) is a neuromorphic processor that implements AHaH computing. The RAM in kT-RAM refers to Random Access Memory. Thermodynamic-RAM is not constrained to just one particular memristive device; any memristive device can be used as long as it meets the following criteria: (1) it is incremental and (2) its state change is voltage dependent. Furthermore, it is possible to emulate kT-RAM (also referred to as ktRAM or kt-RAM) with digital methods, either through simulation on commercial off-the-shelf digital hardware or through the design of custom digital circuits. Note that one non-limiting example of kT-RAM technology is disclosed in U.S. Patent Application Publication No. 20150074029 entitled "ktRAM Design" which published in Mar. 12, 2015 and is incorporated herein by reference in its entirety. Another non-limiting example of kT-RAM technology is disclosed in U.S. Patent Application Publication No. 20150347899 entitled "Cortical Processing with Thermodynamic RAM," which published on Dec. 3, 2015 and is incorporated herein by reference in its entirety.

kT-RAM utilizes what is known as a spike encoding, which is a collection of integers picked from a defined spike space. A good way to picture a spike encoding is as a big bundle of wires (axons), where the total number of wires is the spike space and the set of wires active at any given time is the spike pattern. The algorithms or hardware that convert data into a sparse-spiking representation are called spike encoders. For clarity, some terminology of the spike coding framework is:

Spike: An active spike channel.
Spike Channel: The 'wires' or address spaces that carry spike data.
Spike Space: The total number of spike channels in a spike stream.
Spike Stream: A collection of spike channels used to carry information.
Spike Encoder: Any algorithm or physical circuit that converts data of any type into a spike pattern.
Spike Encoding: A pattern of spikes in a spike space produced by a Spike Encoder. Also called a Spike Pattern.

Spike streams can be combined to form new spike streams. This is advantageous when building a distributed representation of data. For example, a spike encoder SE0 can be used to convert data X into a spike encoding P, S=SE0(X). Another spike encoder SE1 can be used to convert data Y into a spike encoding Q, Q=SE1(Y). Spike encoding P and Q can be joined into a combined spike encoding C=P U Q. A spike stream of size 50 combined with a spike stream of size 100 would therefore result in a combined spike stream of size 150. Furthermore, a spike stream encoding with 5 active spikes combined with a spike stream encoding of 15 active spikes would result in a spike stream of 20 active spikes. As a spike encoding is built up from more than one component spike encoding, the ability of the combined spike encoding to represent intermediate or interpolated states goes up.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for devices, systems and methods that use differential memristor pairs as elements in logical and probabilistic computing as well as machine learning.

It is another aspect of the disclosed embodiments to provide for an instruction set describing voltage drive patterns across collections of differential pairs of memristors.

It is a further aspect of the disclosed embodiments to provide for routines or programs of kt-RAM instruction set sequences describing voltage drive patterns across collections of differential pairs of memristors so as to achieve various machine learning functions.

It is a further aspect of the disclosed embodiments to provide for emulated kT-RAM.

It is another aspect of the disclosed embodiments to provide for physical kT-RAM.

It is still another aspect of the disclosed embodiments to provide for an enhanced computer memory and processing system, apparatus, and method.

The aforementioned aspects and other objectives and advantages can now be achieved as described herein. A method, system and apparatus for unsupervised learning utilizing at least one kT-RAM can be implemented. An evaluation can be performed over a plurality of N AHaH nodes on a spike pattern using a read instruction (FF), and then an increment high (RH) feedback instruction can be applied to the most positive AHaH node among the N AHaH nodes if an ID associated with the most positive AHaH node is not contained in a set, followed by adding a the node ID to the set. In addition, an increment low (RL) instruction can be applied to all AHaH nodes that evaluated positive but were not the most positive, contingent on the most-positive AHaH node's ID not being contained in the set. In addition, node ID's are removed from the set if the set size is equal to N, the number of AHaH nodes. In some example embodiments, all node ID's are removed from the set if the total number of evaluations exceeds a threshold number of evaluations.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
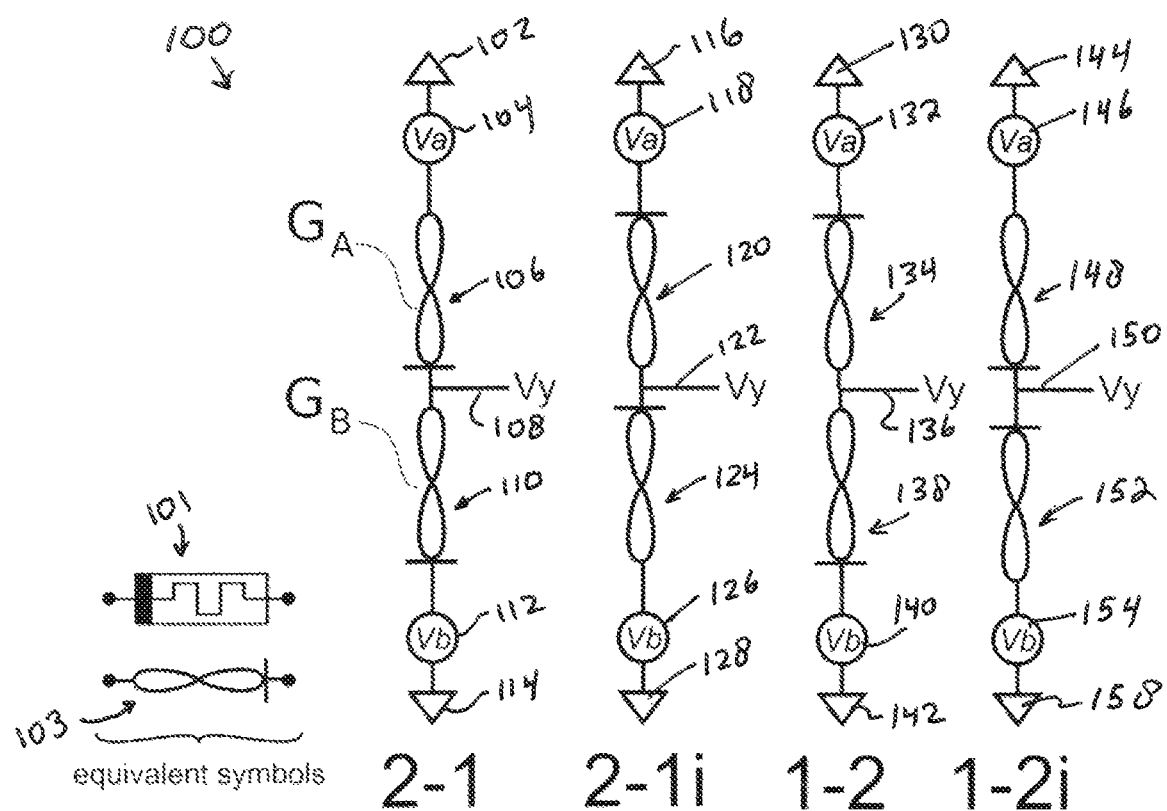
FIG. 1 illustrates a schematic diagram depicting differential pair-synapses with bipolar memristors, in accordance with an example embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems/devices. Accordingly, embodiments may, for example, take the form of hardware, software, firmware or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms, such as "and", "or", or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context. Additionally, the term "step" can be utilized interchangeably with "instruction" or "operation".

Differential Pairs of Memristors in Serial and Anti-Serial Configurations Form Logical and Synaptic Building-Blocks While a variable conductance can be used to encode information, it is not an ideal candidate for a computational building block. While it is desirable for a memristive material to poses high-resolution non-volatile state retention, this is not generally the case in practice. Decay of state is typical, as is variation of device properties during fabrication and operation. Tolerance to decay and material variations can be achieved with a differential-pair representation. Rather then pinning logic levels to absolute voltages or resistances and relying on the intrinsic stability of the materials, a differential pair creates its own reference: "zero" is defined as the state where the conductance of each memristor of the pair is equal. Through passive and active Anti-Hebbian operations, the state of the differential pair can be driven toward zero, adapting to fabrication and operational variations. Since conductance decay is (to a first approximation) a common-mode signal, differential representation provides a degree of isolation by holding state in the difference rather than the absolute conductance.

There are four ways to construct differential pair-synapses with polar memristors, which we call the 1-2, 1-2$i$, 2-1, and 2-1$i$. In our notation, the polarity of a memristor is defined as follows: The bar points to the lower potential end when the conductance of the device increases.

FIG. 1 illustrates a schematic diagram depicting differential pair-synapses 2-1, 2-1$i$, 1-2, and 1-2$i$ with bipolar memristors, in accordance with an example embodiment. In FIG. 1, the differential pair-synapse 2-1 is shown at the far left of the schematic diagram and the differential pair-synapse 1-2$i$ as shown at the far right of the diagram. The differential pair-synapse 2-1 includes a first synapse 106 (also referred to as $G_A$) connected to a voltage $V_a$ 104, which in turn connects to ground 102. A voltage $V_y$ 108 is disposed between the first synapse 106 and a second synapse 110 (also referred to as GB). The second synapse 110 in turn connects to a voltage $V_b$ 112 that in turn connects electronically to ground 114.

The differential pair-synapse 2-1$i$ includes a first synapse 120 connected to a voltage $V_a$ 118, which in turn connects to ground 116. The voltage $V_y$ 122 is disposed between the first synapse 120 and a second synapse 124. The second synapse 124 in turn connects to a voltage $V_b$ 126 that in turn connects electronically to ground 128.

The differential pair-synapse 1-2 includes a first synapse 134 connected to a voltage $V_a$ 132, which in turn connects to ground 130. The voltage $V_y$ 136 is disposed between the first synapse 134 and a second synapse 138. The second synapse 138 in turn connects to a voltage $V_b$ 140 that in turn connects electronically to ground 142.

The differential pair-synapse 1-2$i$ includes a first synapse 148 connected to a voltage $V_a$ 146, which in turn connects to ground 140. The voltage $V_y$ 150 is disposed between the first synapse 148 and a second synapse 152. The second synapse 152 in turn connects to a voltage $V_b$ 154 that in turn connects electronically to ground 158.

Synaptic State Dimensions

The state of a differential pair synapse S formed of two memristors is given as the conductance of each memristor of the pair, $S=[G_A,G_B,]$. Application of various voltage drive patterns ('instructions') to each synaptic configuration cause changes in the synaptic state and can be categorized along three primary 'control dimensions'. Each control dimension enables various mechanisms of programming or learning, and all are available to a differential pair synapse.

Negative/Positive Control

The synaptic differential, $G_A-G_B$, controls the multiplicative state (positive or negative) of the synapse and can be moved in the positive or negative direction. These operations may also affect the accumulation or conjugate state, $G_A+G_B$, if an incrementation of one memristor is not balanced by a decrementation of the other.

Anti-Hebbian/Hebbian Control

The synaptic state is moved toward (Anti-Hebbian) or away (Hebbian) from zero resulting in negative and positive feedback, respectively, over the synaptic state. AHaH control operations may be passive, in which case no external logic circuit is needed to drive it. Examples include the FF (Anti-Hebbian) and RF (Hebbian) kT-RAM instructions on a 2-1 circuit configuration. AHaH control operations may also be active, resulting in more complex AHaH plasticity that is state dependent. Examples include the FF-RU and FF-RA instructions on a 2-1 circuit configuration.

Note that as utilized herein the term AHaH (or AHAH) refers generally to Anti-Hebbian and Hebbian and AHaH technology, and in particular can refer to AHaH hardware and/or software chips and/or applications. One non-limiting example of AHaH technology is disclosed in U.S. Pat. No. 9,269,043 entitled "Memristive neural processor utilizing anti-hebbian and hebbian technology," which issued on Feb. 23, 2016 and is incorporated herein by reference in its entirety. Another non-limiting example of AHaH technology is disclosed in U.S. Pat. No. 9,152,917 entitled "Framework for the evolution of electronic neural assemblies toward directed goals," which issued on Oct. 6, 2015 and is also incorporated herein by reference in its entirety.

Conjugate Control

The increase or decrease in the sum over both memristors of the pair (GA+GB), can be used as a measure of evidence accumulation or to control learning properties such as annealing or anti-annealing.

Encodings

A differential zero reference allows for natural logical binary and logical tertiary as well as synaptic multiplicative state encoding.

Binary Encodings

The logical state can be defined as true if the difference in conductance of the pair is positive (GA−GB>0) and false if the difference in conductance of the pair is negative (GA−GB<0), or visa versa.

Tertiary Encodings

The zero reference also provides a natural tertiary logical encoding, where "−1" is defined if the differential is below a fixed negative voltage (GA−GB<−δ), "+1" if the differential is above a fixed positive voltage (GA−GB<+δ), and "0" if it is between the two fixed differentials (−δ<GA−GB<δ). Tertiary representations are useful for some logical operation such as addition, since they can eliminate a carry-cascade.

Probabilistic Encodings

Differential conductance can be used to represent a continuously variable quantity that encodes weight or probabilistic information while enabling multiplicative state transfer. These properties are useful for probabilistic synaptic operations such as accumulating probabilities and performing inferences over the accumulated probabilities.

Evidence Accumulation

While the conductance differential (GA−GB) can be used to encode state, the conjugate (GA+GB) can be used to encode accumulation or 'experience' information, which is useful for combining weights in inference operations to account for various levels of evidence, and also to combine inferences across multiple cores with various levels of experience.

Consider, for example, the case where the conductance of each memristor in the pair varies by integer multiples (Gi=1, 2, 3, . . . , N) and is initialized into a low conducting state GA=GB=1. Let us presume that the differential pair is used to measure the co-occurrence of some factor or feature with a target predictive state. Each time target predictive state 'A' occurs we increment GA, GA=GA+1, and each time target event 'B' occurs we increment GB: GB=GB+1. At some time in the future, after accumulating evidence, the value of the differential pair synapse S0 is S0=GA,GB=[100,50]. Let us presume a 2-1 synapse configuration, so that the output voltage is given by VS0=GA−GBGA+GB=50150=13. Equivalently, the let us presume a second synapse which has accumulated less evidence over another factor, S1=GA,GB=[1,2]. In this case, the output voltage is VS 1=GA−GBGA+GB=−13. While each synapse has measured equal and opposite probabilities or weighting factors, synapse S0 has gathered more evidence. S0 thus has higher statistical significance and, when S0 and S1 are combined, S0 should dominate.

When both synapses are read together in a 2-1 circuit configuration, evidence accumulation is accounted for: Vy=iGAi−GBiiGAi+GBi=50−1150+3=49153≈13.

A common practice in learning algorithms concerns decreasing the learning or adaptation rate of weights over time. Annealing speeds up learning and provides mechanisms to escape local minima by enabling large changes in the beginning of the learning process that reduce over time until the final modifications are minor fine-tune refinements. Annealing is built into a differential synapse representation if each memristor in the pair is initialized to its low conducting state before learning begins. As the conjugate grows and evidence accumulates, the same change in the differential causes smaller changes in the synaptic output. This can be exploited in the opposite direction as well if it is desired that the output signal grow in magnitude from zero as evidence accumulates. This is useful, for example, in combining predictions across multiple kT-RAM cores that differ in experience.

Combining predictions across multiple kT-RAM cores is necessary when the total input spike space exceeds an individual core's capacity. When this occurs, the overflow spikes can be sent to another core. However, this introduces the problem of combining predictions from multiple cores. If both cores contain synapses initialized low and the output voltages of each core are averaged, then equal weight will be given to both cores. The result is a degradation in prediction performance when the overflow, which is less experienced and thus noisy, contributes to the result. A solution to this problem is to initialize the primary core into low conductance states while initializing subsequent over-flow cores into high or medium conduction states. In this way, learning can take place quickly on the primary core, and subsequent cores only contribute meaningful (non-zero) signals once they have accumulated sufficient experience.

kT-RAM

Differential pair synapses can be selectively coupled together and driven with voltage patterns that modify the synaptic state. The set of voltage drive patterns can be referred to as the kT-RAM instruction set. Routines of kT-RAM instructions over a collection of differential-pair synapses results in higher-level functions including logic and machine learning. The set of one or more differential-pair synapses that can be coupled together is termed an AHaH node. A kT-RAM core is a hardware substrate that enables selective coupling of differential pair synapses and execution of pre-defined drive patterns determined by an instruction set. KT-RAM is a collection of kT-RAM Cores. AHaH nodes are the basic computation building block for AHaH Computing and kT-RAM is the computation substrate from which AHaH Computing is practically possible.

The kT-RAM interface defines a basic set of methods to create, destroy, and execute instructions on AHaH nodes, among other functions. These methods are used to demonstrate various routines of instructions for accomplishing machine learning functions. The kT-RAM interface shown below is one specific implementation in the Java® programming language that we can use to illustrate various AHaH routines. While it is defined for the 2-1 synapse configuration, it can be appreciated that many other interfaces are possible which accomplish the same basic functions, and each interface may be defined over a specific synapse configuration or combination of configurations, for any number of formal languages.

```
public interface IKtRAM {
/**
* Instructions:
* FF:FORWARD-FLOAT
* FH:FORWARD-HIGH
* FL:FORWARD-LOW
* FU:FORWARD-UNSUPERVISED
* FA:FORWARD-ANTI-UNSUPERVISED
* FZ:FORWARD-ZERO
* RF:REVERSE-FLOAT
* RH:REVERSE-HIGH
* RL:REVERSE-LOW
* RU:REVERSE-UNSUPERVISED
* RA:REVERSE-ANTI-UNSUPERVISED
* RZ:REVERSE-ZERO
* FFLV: Same as FF but with a low read voltage
* RFLV: Same as RF but with a low read voltage
*XX:Nothing. No instruction is executed.
*
* The direction of the applied voltage->
* FORWARD: Causes the synaptic channels to move
    toward saturation in maximally conductive state.
* REVERSE: Causes the synaptic channels to move
    toward saturation in minimally conductive state.
*
* Feedback Voltage->
* FLOAT: No feedback given. Used for read operations.
* HIGH: Forces Vy to -V, causing next read operation to
    evaluate Higher (when RH follows FF, opposite for
    RF-FH)
* LOW: Forces Vy+V, causing next read operation to
    evaluate Lower (when RL follows FF, opposite for
    RF-FL)
* UNSUPERVISED: If Vy>=0 during previous read
    operation, forces Vy to -V, else forces Vy to +V (when
    RU follows FF, opposite for RF-FU)
* ANTI_UNSUPERVISED: Opposite of UNSUPER-
    VISED: Sets Vy to 0 volts. (when RA follows FF,
    opposite for RF-FA)
*
*/
enum Instruction {
    FF, FFLV, FH, FL, FU, FA, FZ,
    RF, RFLV, RH, RL, RU, RA, RZ,
    XX
}
/**
* Mean memristor conduction between low conductance
    state (0) and high conductance state (1).
*/
enum SynapticlnitType {
MEDIUM(0.5f, 0.05f),
LOW(0f, 0.05f),
HIGH(1f, 0.05f),
LOW_NOISE(0f, 0.25f),
LOW_NOISELESS(0f, 0f),
MEDIUM_NOISE(0.5f, 0.25f),
MEDIUM_NOISELESS(0.5f, 0f);
final float initConductance;
final float randVar;
SynapticlnitType(float initConductance, float randVar) {
    this.initConductance=initConductance;
    this.randVar=randVar;
}
public float getinitConductance( ) {
    return initConductance;
}
public float getRandVar( ) {
    return randVar;
    }
}
boolean doesAHaHNodeExist(String id);
Set<String>getAllAHaHNodeLabels( );
LinkedHashMap<String, Float>getNonSortedPredictions
    (Set<String>iDs);
/**
* @param id the id of the AHaH node to create
* @param spikeSpace the spike space of the AHaH node
    to create
* @param synapticinitType the synaptic initialization of
    the ahah node.
* @return true if it was created, false if it failed (for
    example if it already existed)
*/
boolean create(String id, char spikeSpace, Synapticinit-
    Type synapticinitType);
/**
* De-allocate all synapses above a certain spike ID
*
* @param id the ID of the AHaH node to deallocateSyn-
    apses synapses
* @param largestSpike all synapses with higher index
    than this will be de-allocated to free up space.
* @return
*/
boolean deallocateSynapses(String id, char largestSpike);
/**
* De-allocates the AHaH Node specified by id
*
* @param id The unique string identifier of the AHaH
    Core
```

```
* @return
*/
void destroy(String id);
/**
* Destroys all AHaH Nodes in memory and/or on hard-
    drive.
*/
void destroyAll( );
/**
* @param id The unique string identifier of the node
* @param spikes The spikes to set active. Must be within
    the spike-space of the AHaH Core.
*/
void setSpikes(String id, char[ ] spikes);
/**
* @param id The unique string identifier of the AHaH
    Core
* @param forwardVoltage The operating voltage (mag-
    nitude) of the core in the forward direction
* @param reverseVoltage The operating voltage (magni-
    tude) of the core in the reverse direction
*/
void setDriveVoltage(String id, float forwardVoltage,
    float reverseVoltage);
/**
* @param id the AHaH Node ID
* @param i1 the first instruction
* @param i2 the second instruction
* @return y the output of the instruction between +/−1
*/
float execute(String id, Instruction i1, Instruction i2);
}
``` kT-RAM Core Emulation kT-RAM is a fundamentally new type of hardware that unites computation and memory. While its full potential is realized via its implementation with memristive technology, it is possible to emulate it with digital methods. Emulation cores can be developed to cover a range of simulation requirements, from ultra efficiency on digital platforms to accurate circuit models that include circuit nonlinearities, random fluctuations and temperature effects.

A digital representation is the most computationally efficient representation for current digital emulators (CPUs, FPGAs, GPUs etc). Two main types of digital kT-RAM cores differ in their internal logic for calculating the AHaH node output voltage. Float Core types use internal floating-point operations, while Integer Core types use integer representation.

In the code below, the method: readGab(spikes[i]);
returns an array that contains the conductances of the synapse associated with the given spike channel, and spikes[ ] is an array containing the current spike pattern. Note that this computation represents the voltage of a collection of selected differential pair synapses:

$$Vy = ViGai - GbiiGai + Gbi$$

Float Core Read
```
private float read(float voltage) {
    float top=0;
    float bottom=0;
    for (char i=0; i<spikes.length; i++) {
        float[ ] Gab=readGab(spikes[i]);
        top+=(Gab[0]−Gab[1]);
        bottom+=(Gab[0]+Gab[1]);
    }
    return voltage*top/bottom;
}
```

Integer Core Read
```
private int read(int voltage) {
    int top=0;
    int bottom=0;
    for (char i=0; i<spikes.length; i++) {
        int[ ] Gab=readGab(spikes[i]);
        top+=(Gab[0]−Gab[1]);
        bottom+=(Gab[0]+Gab[1]);
    }
    return (top<<R)/bottom*voltage/V;
}
```

In the code above, 'R' is the number of bits of resolution used to represent the evaluate voltage over the synapse, and 'V' is the maximum voltage represented as an integer (two raised to the power of $2^R$).

kT-RAM Instruction Set Routines kT-RAM comprises one or more kT-RAM Cores, and each core comprises a collection of differential-pair synapses that can be selectively coupled together and driven with an instruction. While the most flexible processing configuration is when kT-RAM acts as a co-processor to a microprocessor so that any possible instruction set routine is possible, it is also possible to encode instruction set routines directly in the hardware controllers that execute instructions in a core or cores. The former provides greater flexibility at run time with reduced power efficiency while the later is limited to the specific routine but is more efficient. We disclose below a number of useful routines for performing low-level machine learning functions related to unsupervised and supervised learning.

The code written below has been written in the Java® programming language. Common functions such as sorting are used, as well as Java® library classes like Maps. The implementation of such functions is not intended to be limited to any one language, technique, algorithm or technology. While we have defined the routines as a Java® program and utilized some Java® library functions, it is clear that the routines could be translated into other programming languages as well as dedicated hardware or combinations thereof. Note that Java® is a trademark of Oracle America, Inc. What we disclose below is intended to be a formal yet general description of a computational process applied to a hardware resource that any technical expert could easily understand and translate to a specific implementation, be it a computer program, hardware circuit or combination thereof.

AHaH Partitioners

A basic operation in machine learning deals with supervised (labels provided) and unsupervised (no labels provided) data representations. Algorithms such as k-Means or Restricted Boltzmann Machines are known as auto-encoders, which serve to find an alternate representation of the data that are aligned with its natural variances. An AHaH node can be seen as a hardware manifestation of a linear neuron with a squashed activation function, and the value of its synapses determines its decision boundary, which acts to partition its input phase-space. AHaH nodes acting to bifurcate or resolve regions of the input phase space are called partitioners. That is, they act to partition the input phase space into distinct regions, with each region encoded as an integer in a spike space. Anti-Hebbian learning acts to bifurcate the input phase space into roughly equal partitions. This bifurcation, however, may bisect regions of high data density, resulting in poor discrimination and noise tolerance.

Hebbian learning, on the other hand, acts to maximize the decision boundary between opposing data distributions, improving discrimination and noise tolerance. However, the resulting positive feedback, if left unchecked, can result in null-state occupation. The goal of an AHaH partitioner is to cleanly discriminate while simultaneously bifurcating the phase-space into as equal partitions as possible given the data structure.

We have previously reported on methods of achieving clustering operations with collections of AHaH nodes independently operating the FF-RU instruction sequence. Such methods work well for sparse spike encodings, but are prone to Null-state occupation for other spike encodings, which is the condition where every synapse has converged to the same synaptic state and thus becomes useless as a partitioner. That is, the partition becomes the entire phase-space, not a sub-set. The Null state is caused by Hebbian learning and is the conclusion of a positive-feedback cycle where the "rich get richer" until only one global synaptic state remains. Avoiding null-state occupation is relatively simple and involves various techniques that share a basic pattern of gating Hebbian learning. The following kT-RAM Routines are examples of AHaH partitioners.

RCU Partitioner

The RCU Partitioner is the simplest mechanism to prevent null-state occupation. The operating principle is to only allow Hebbian modification via the RU instruction if the last evaluation state has changed. While this partitioner will avoid a decent into the null state, it is still possible for some spike patterns, especially if they are not sparse.

```
public class RCUPartitioner {
    private KtRAM ktram=new KtRAM(AHaHCore-
        Type.MSS_MEM);//variable core types
    private boolean lastEvaluationState=false;
    private String AHaHNodeID="0";
    public RCUPartitioner( ){
        ktram.create(AHaHNodeID, (char)(1<<16),
SynapticInitType.LOW);//variable spike spaces. variable synaptic initializations.
    }
    public float evaluateAndAdapt(char[ ] spikes){
        ktram.setSpikes(AHaHNodeID, spikes);
        float y=ktram.execute(AHaHNodeID, Instruction.FF,
            Instruction.XX);
        boolean evaluationState=y>=0;
        if(evaluationState!=lastEvaluationState){
            ktram.execute(AHaHNodeID,    Instruction.RU,
                Instruction.XX);
        }else{
            ktram.execute(AHaHNodeID,    Instruction.RF,
                Instruction.XX);
        }
        lastEvaluationState=evaluationState;
        return y;
    }
}
```

TRA Partitioner

The TRA Partitioner resolves the problem with the RCU partitioner by actively driving Anti-Hebbian learning via the RCA instruction if the state has not changed in a pre- specified number of evaluations. It is thus impossible for the TRA partitioner to fall into the null state since it can 'backtrack'.

```
public class TRAPartitioner {
    private boolean lastEvaluationState=false;!! the last
        evaluation state.
    private int c=0;!! count of the number of times a node has
        evaluated in the same way.
    private int t_RA=2;//variable. The number of times a node
        must evaluate the same way before RA instruction
        (AntiHebbian Plasticity) is triggered.
    private String AHaHNodeID="0";
    private KtRAM    ktram=new    KtRAM(AHaHCore-
        Type.MSS_MEM);//variable core types
    public TRAPartitionerO{
        ktram.create(AHaHNodeID, (char)(1<<16),
SynapticInitType.LOW);//variable spike spaces. variable synaptic initializations.
    }
    public float evaluate(char[ ] spikes){
        ktram.setSpikes(AHaHNodeID, spikes);
        return ktram.execute(AHaHNodeID, Instruction.FFLV,
Instruction.RFLV);//low voltage to minimize disturbance
    }
    public float evaluateAndAdapt(char[ ] spikes){
        ktram.setSpikes(AHaHNodeID, spikes);
        float y=ktram.execute(AHaHNodeID, Instruction.FF,
            Instruction.XX);
        boolean evaluationState=y>=0;
        c=evaluationState==lastEvaluationState? c+1:0;
        if (c>=t_RA) {
            ktram.execute(AHaHNodeID, Instruction.RA, Instruc-
                tion.XX);
        }else {
            ktram.execute(AHaHNodeID, Instruction.RU, Instruc-
                tion.XX);
        }
        lastEvaluationState=evaluationState;
        return y;
    }
}
```

Competitive Partitioner

The competitive partitioner is formed of 2 or more AHaH Nodes that compete for Hebbian feedback. On each evaluate cycle, a spike pattern is loaded and a read instruction is executed. The ids of all AHaH nodes that exceed a threshold, usually set at zero, are output from the partitioners. The AHaH Node with the highest activation is considered the winner and it is incremented high with the FF-RH instruction, while all nodes that output above threshold but were not the winner are incremented low with the FF-RL instruction.

The use of a set is used to prevent a winner-take condition where the winner gets feedback, resulting in higher probability of being the winner on the next cycle, which causes more Hebbian reinforcement, and so on until it is always the winner. Feedback is only given if the winner is not already in the set. When the set accumulates the IDs of all AHaH nodes or if a pre-specified amount of evaluation cycles have passed (Gather Abandon), the buffer is cleared. The use of the buffer insures that each node receives the same amount of Hebbian learning, which in turn prevents one AHaH node from capturing the whole phase space and results in equitable partitioning of the phase space across the nodes.

```
package org.knowm.advancements_in_ahah_computing.code;
import java.util.ArrayList;
import java.util.Collections;
```

```
import java.util.HashSet;
import java.util.List;
import org.knowm.knowm_core.ktram.IKtRAM;
import org.knowm.knowm_core.ktram.IKtRAM.Instruction;
import org.knowm.knowm_core.ktram.IKtRAM.SynapticInitType;
import org.knowm.knowm_core.ktram.KtRAM;
import org.knowm.knowm_core.ktram.KtRAM.AHaHCoreType;
import it.unimi.dsi.fastutil.chars.CharArraySet;
import it.unimi.dsi.fastutil.chars.CharSet;
public class CompetitivePartitioner {
    private final IKtRAM ktram= new KtRAM(AHaHCoreType.MSS_MEM);//variable core type
    private final int numBasis=10;//variable. 2 or more.
    private int gatherAbandon=200;//variable. 'numBasis' or larger.
    private final HashSet<Character>buffer = new HashSet< >( );
    private int count = 0;
    private float mostActiveNodeValue;//used for anomaly detection.
    public CompetitivePartitioner( ) {
        for (char i = 0; i < numBasis; i++) {
            ktram.create(i+" ", (char) ((1 << 16) - 1), SynapticInitType.MEDIUM);//variable spike space. Variable synaptic initialization.
        }
    }
    public char[ ] encode(char[ ] spikes) {
        List<SpikeValue> nodeOutputs = getNodeOutputs(spikes);//ranked by node activation
        return toOutputSpikes(nodeOutputs);
    }
    public char[ ] encodeAndAdapt(char[ ] spikes) {
        List<SpikeValue>nodeOutputs = getNodeOutputs(spikes);//ranked by node activation
        learn(nodeOutputs);
        return toOutputSpikes(nodeOutputs);
    }
    private char[ ] toOutputSpikes(List<SpikeValue> nodeOutputs){
        CharSet spikeAboveZeroConfidence=new CharArraySet( );
        for (int i = 0; i < nodeOutputs.size( ); i++) {
            if(nodeOutputs.get(i).value>0){
                spikeAboveZeroConfidence.add(nodeOutputs.get(i).spike);
            }else{
                break;
            }
        }
        return spikeAboveZeroConfidence.toCharArray( );
    }
    private void learn(List<SpikeValue> nodeOutputs) {
        if (buffer.size( ) >= num Basis || count == gatherAbandon) {
            buffer. clear( );
            count = 0;
        }
        char bestGuess = nodeOutputs.get(0).spike;
        if (!buffer.contains(bestGuess)) {
            for (int i = 0; i < nodeOutputs.size( ); i++) {
                if (i == 0) {
                    ktram.execute(nodeOutputs.get(i).spike+" ", Instruction.FF,Instruction.RH);
                } else if(nodeOutputs.get(i).value>0) {
                    ktram.execute(nodeOutputs.get(i).spike+" ", Instruction.FF,Instruction.RL);
                }else{
                    break;
                }
            }
            buffer.add(bestGuess);
        }
        count++;
    }
    private List<SpikeValue>getNodeOutputs(char[ ] spikes) {
        List<SpikeValue>spikeValues=new ArrayList<SpikeValue>( );
        for (char i = 0; i < numBasis; i++) {
            ktram.setSpikes(i+" ", spikes);
            float y=ktram.execute(i+" ", Instruction.FFLV, Instruction.RFLV);
            spikeValues.add(new SpikeValue(i, y));
        }
        Collections.sort(spikeValues);//sort descending, high-->low
        mostActiveNodeValue=spikeValues.get(0).value;
        return spikeValues;
    }
    private float getMostActiveNodeValue( ){
        return mostActiveNodeValue;
    }
```

```
class SpikeValue implements Comparable<SpikeValue>{
        public final char spike;
        public final Float value;
        publicSpikeValue(char spike, Float value){
            this.spike=spike;
            this.value=value;
        }
      @Override
      public int compareTo(SpikeValue spikeValue) {
            return spikeValue.value.compareTo(value);
      }
  }
}
```

Binary Competitive Partitioner

The Binary Competitive Partitioner is a pair of AHaH nodes that compete for Hebbian feedback and is the limiting case of the Competitive Partitioner when the number of nodes is two. This class is most useful when combined into a decision tree or a collection.

```
package org.knowm.advancements_in_ahah_computing.code;
import org.knowm.knowm_core.ktram.KtRAM;
import org.knowm.knowm_core.ktram.IKtRAM.Instruction;
import org.knowm.knowm_core.ktram.IKtRAM.SynapticlnitType;
import org.knowm.knowm_core.ktram.KtRAM.AHaHCoreType;
public class BinaryCompetitivePartitioner {
private KtRAM ktram=new KtRAM(AHaHCoreType.MSS_MEM);//variable core types.
    private final String aID;//the ID of AHaH node 'A'
    private final String bID;//the ID of AHaH node 'B'
    private boolean a = false;//true if node has received Hebbian(RH) feedback.
    private boolean b = false;//true if node has received Hebbian(RH) feedback.
    private float mostActiveNodeValue;
    public BinaryCompetitivePartitioner( ) {
       this.aID = "a";
       this.bID = "b";
       ktram.create(aID, (char) ((1 << 16) - 1),
SynapticlnitType. MEDIUM_NOISE);//variable synaptic init types
       ktram.create(bID, (char) ((1 << 16) - 1), SynapticlnitType. MEDIUM_ NOISE);
    }
    public boolean encode(char[ ] spikes) {
          ktram.setSpikes(aID, spikes);
          float y_a = ktram.execute(aID, Instruction.FFLV, Instruction.RFLV);//low voltage
for minimal disturbance
          ktram.setSpikes(bID, spikes);
          float y_b = ktram.execute(bID, Instruction.FFLV, Instruction.RFLV);//low voltage
for minimal disturbance
          boolean y = y_a > y_b;
          return y;
    }
    public boolean encodeAndAdapt(char[ ] spikes) {
       ktram.setSpikes(aID, spikes);
       float y_a = ktram.execute(aID, Instruction.FFLV, Instruction.RFLV);//low voltage for
minimal disturbance
       ktram.setSpikes(bID, spikes);
       float y_b = ktram.execute(bID,Instruction.FFLV, Instruction.RFLV);//low voltage for
minimal disturbance
       boolean y = y_a > y_b;
         if (y) {
           if (!a) {
              ktram.execute(aID, Instruction.FF,Instruction.RH);// reward
              if (y_b > 0) {
                 ktram.execute(bID, Instruction.FF, Instruction.RL);// punish
              }
              a = true;
           }
           mostActiveNodeValue=y_a;
         } else {
         if (!b) {
           ktram.execute(bID, Instruction.FF, Instruction.RH);// reward
           if (y_a > 0) {
              ktram.execute(aID, Instruction.FF, Instruction.RL);// punish
           }
           b = true;
         }
         mostActiveNodeValue=y_b;
         }
         if (a && b) {
```

```
        a = b = false;// reset
    }
    return y;
}
public float getMostActiveNodeValue( ){
        return mostActiveNodeValue;
    }
}
```

Figure 2:
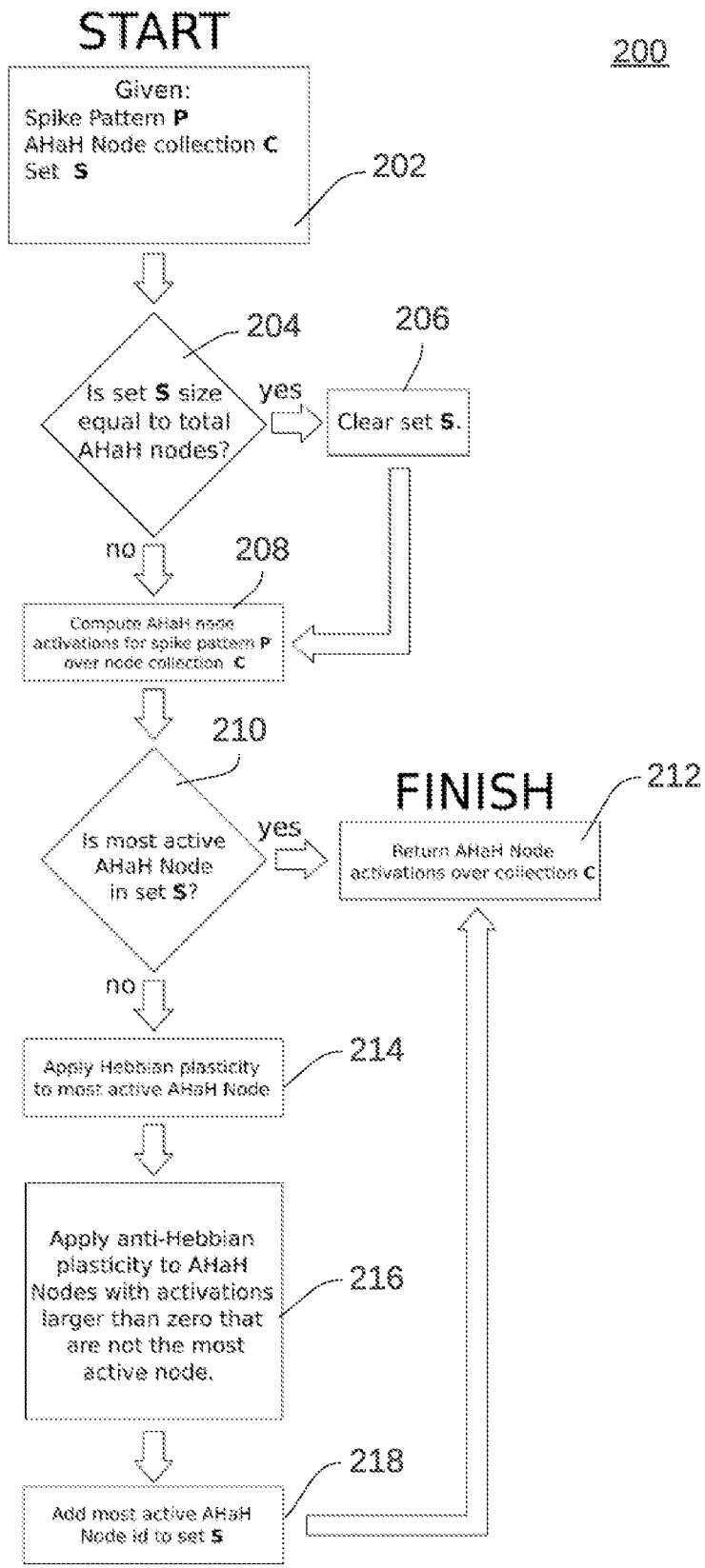
FIG. 2 illustrates a flow chart of operations depicting logical operational steps of a method for implementing a binary competitive partitioner, in accordance with an example embodiment.

FIG. 2 illustrates a flow chart of operations depicting logical operational steps, instructions or steps of a method 200 for implementing a binary competitive partitioner, in accordance with an example embodiment. That is, the above code can be summarized in the context of the logical operations of the method 200 shown in FIG. 2. Note that the terms step, operation and instruction can be utilized interchangeably to refer to the same feature.

As shown at block 202, the method 200 can be initiated, wherein a spike pattern P, an AHaH Node collection C, and a set C are initially provided. Next, as shown at decision block 204, a test or decision action can be implemented to determine whether or not to clear set S, as shown next at block 206, or to compute AHaH node activations for spike pattern P over node collection C. Note that the step, operation or instruction shown at block 206 can be implemented if the answer to step, operation or instruction indicated at decision block 204 is "yes". If so then the operation shown at block 206 is processed followed by the operation depicted at block 208. If, however, the answer with respect to the step, operation or instruction indicated at decision block 204 is "no", the operation depicted at block 208 is processed immediately after processing of the step, operation or instruction shown at block 208.

Following processing of the operation depicted at block 208, a step or operation can be implemented, as shown at decision block 210, to determine if the most active AHaH node is contained in set S. If yes, then the operation depicted at block 212 is implemented, wherein AHaH Node activations are returned over the collection C. The process then ends (i.e., FINISH). If the answer with respect to decision block 210 is "no", then Hebbian plasticity is applied to the most active AHaH Node as shown at block 214. Thereafter anti-Hebbian plasticity can be applied to AHaH Nodes with activations larger than zero that are not the most active node, as indicated at block 216. The most active AHaH Node ID can be then added to set S, as described at block 218. Thereafter, the operation shown at block 212 can be processed, wherein AHaH Node activations are returned over collection C. The process then ends.

Of note is that the set S can be replaced with two binary variables and the counter can be eliminated.

Binary Competitive Partitioner Tree

Partitioners can be combined into decision trees to form sparse autoencoders, i.e., basis encoders. In many applications, in particular vision, it is desirable to represent data with many features or 'bases'. A tree with a depth of 10 formed from, for example, Binary Competitive Partitions, can partition the input phase space into a maximum of 1024 regions, where each region corresponds to a leaf of the tree. Trees with branching factors greater than two are possible, for example by using the Competitive Partitioner.

```
package org.knowm.advancements_in_ahah_computing.code;
public class BinaryCompetitivePartitionerTree{
    private final int depth=8;//variable tree depths.
    private final BinaryCompetivePartitioner[ ] nodes;//can be any binary partitioners
    public BinaryCompetitivePartitionerTree( ) {
        nodes = new BinaryCompetivePartitioner[(int) Math.pow(2, depth)];
        for (int i = 0; i < nodes.length; i++) {
            nodes[i] = new BinaryCompetivePartitioner( );
        }
    }
    public char encode(char[ ] spikes) {
        int path = 0;
        int idx = 1;
        for (int i = 0; i < depth; i++) {
            int nodeIndex = (path | idx);
            if (nodes[nodeIndex].encode(spikes)) {
                path = path | idx;
            }
            idx = idx << 1;
        }
        return (char) path;
    }
    public char encodeAndAdapt(char[ ] spikes) {
        int path = 0;
        int idx = 1;
        for (int i = 0; i < depth; i++) {
            int nodeIndex = (path | idx);
            if (nodes[nodeIndex].encodeAndAdapt(spikes)) {
                path = path | idx;
            }
            idx = idx << 1;
        }
        return (char) path;
    }
}
```

Binary Competitive Partitioner Tree Collection

While decision trees excel at partitioning of data, they can consume a great deal of synaptic resources. An exponentially more synapse efficient alternative can involve forming a joint encoding over a smaller collection of binary partitioners. The technique greatly reduces the required synapses and may be appropriate for very sparse data with few underlying clusters. That is, this partitioner is more synapse efficient but its ability to form clusters may be reduced.

```
package org.knowm.advancements_in_ahah_computing.code;
public class BinaryCompetitivePartitionerCollection {
    private final int depth=8;//variable depth
    private final BinaryCompetivePartitioner[ ] nodes=new BinaryCompetivePartitioner[depth];
    public BinaryCompetitivePartitionerCollection( ) {
        for (int i = 0; i < nodes.length; i++) {
            this.nodes[i] = new BinaryCompetivePartitioner( );
        }
    }
    public char encode(char[ ] spikes) {
        int path = 0;
        int idx = 1;
        for (int i = 0; i < depth; i++) {
            if (nodes[i].encode(spikes)) {
                path = path | idx;
            }
            idx = idx << 1;
        }
        return (char)path;
```

```
        }
        public char encodeAndAdapt(char[ ] spikes) {
                int path = 0;
                int idx = 1;
                for (int i = 0; i < depth; i++) {
                   if (nodes[i]encodeAndAdapt(spikes)) {
                       path = path | idx;
                   }
                   idx = idx << 1;
                }
                return (char)path;
           }
    }
```

Temporal Rate of Change of Confidence of Competitive Partitioners Provide Anomaly Information The Competitive Partitioner and Binary Competitive Partitioners are capable of providing an anomaly signal from the rate of change of the most active AHaH node on each cycle. When the running average confidence of the most active AHaH node drops, this signals that the input data statistics are changing. To detect a fall in the average confidence value one can take the difference of two exponential moving averages. The more positive the resulting value, the more anomalous the conditions.

```
public class CornpetitiveAnomalyNode {
   private BinaryCompetivePartitioner binaryCompetiveParti-
tioner;
   private ExpAveDiff expAveDiff;
   // k0>k1, 0>k0<1, 0<k1<0
   public CompetitiveAnomalyNode (float k0,float k1){
       binaryCompetivePartitioner=
       new BinaryCompetivePartitioner( );
       expAveDiff=new ExpAveDiff(k0, k1);
   }
   public float getAnomalySignal(char[ ] spikes){
       binaryCompetivePartitioner.evaluateAndAdapt(spikes);
       return
expAveDiff.update
(binaryCompetivePartitioner.getMostActiveNodeValue( ));
   }
   class ExpAveDiff {
       private final ExpRunAve ave0;
       private final ExpRunAve ave1;
       private float last = 0;
       public ExpAveDiff(float k0, float k1) {
          this.ave0 = new ExpRunAve(0, k0);
          this.ave1 = new ExpRunAve(0, k1);
       }
       public float update(float input) {
          last = ave1.update(input) - ave0.update(input);
          return last;
       }
   }
   class ExpRunAve {
       private float x;// the value
       private final float k;// the adaptation rate
       private final float kp;// 1-k
       public ExpRunAve(float initialValue, float k) {
          this.x = initialValue;
          this.k = k;
          this.kp =1 - k;
       }
       public float update(float input) {
          x = kp * x + k * input;
          return x;
       }
    }
}
```

Another method to achieve anomaly detection is to pair synaptic decrementation of spike pattern synapses with period incrementation of all synapses in the spike space (or visa versa). The result is that synapses associated with spike channels that are infrequently active become positive, while synapses associated with frequently active spike channels become negative. The more normal a pattern is, the lower the resulting AHaH node output value.

```
public class IncrementationDecayAnomalyNode implements
Serializable {
    private KtRAM ktram=new KtRAM(AHaHCoreType.MSS_MEM);
    //variable core types
    private String AHaHNodeID="0";
    private char[] allSpikes;
    private int decayPeriod=5;//variable decay periods.
    private int t=0;
    public IncrementationDecayAnomalyNode( ) {
         char coreSpikeSpace=(char)(1<<16);
         ktram.create(AHaHNodeID, coreSpikeSpace,
            SynapticInitType.LOW);
         allSpikes = new char[coreSpikeSpace];
         for (char i = 0; i < allSpikes.length; i++) {
             allSpikes[i] = i;
         }
    }
    public float evaluateAndAdapt(char[ ] spikes) {
        ktram.setSpikes(AHaHNodeID, spikes);
        float y = ktram.execute("a", Instruction.FF, Instruction.RL);
        //forces synapses
associated with normal patterns low.
        if (t++ % decayPeriod == 0) {
            decay( );
        }
        return y;
    }
    private void decay( ) {
        ktram.setSpikes(AHaHNodeID, allSpikes);
        ktram.execute("a", Instruction.FF,Instruction.RH);
        //forces all synapse high.
    }
        }
```

Classifiers

Classification is a basic machine learning operation that maps an input pattern into one or more labels, generally with a confidence estimation. A number of classifiers can be constructed from kT-RAM instruction set routines.

Simple Classifier

The Simple Classifier utilizes one AHaH node per supervised label. The output is the confidence that the label associated with the AHaH node belongs to the input spike pattern.

```
package org.knowm.advancements_in_ahah_computing.code;
import java.util.Set;
import org.knowm.knowm_core.ktram.IKtRAM;
import org.knowm.knowm_core.ktram.IKtRAM.Instruction;
import org.knowm.knowm_core.ktram.IKtRAM.SynapticInitType;
import org.knowm.knowm_core.ktram.KtRAM;
import org.knowm.knowm_core.ktram.KtRAM.AHaHCoreType;
public class SimpleClassifier {
    private String[ ] labels;
    private final IKtRAM kTRAM;
    public SimpleClassifier(String[ ] labels) {
         char spikeSpace = (char) ((1 << 16) - 1);
         this.kTRAM = new KtRAM(AHaHCoreType.BYTE);//variable core
         for (int i = 0; i < labels.length; i++) {
              kTRAM.create(labels[i], spikeSpace,
                 SynapticInitType.LOW); // create one AHaH
node for each label. Variable Synaptic Initialization
         }
         this.labels=labels;
    }
    public float[ ] classify(char[ ] spikes, Set<String> truthLabels) {
              float[ ] outputNodeActivations=new float[labels.length];
         for (int i = 0; i < labels. length; i++) {
              String nodeID=labels[i];
```

```
        kTRAM.setSpikes(nodeID, spikes); // set AHaH node spikes
        float y;
        if (truthLabels!=null) {//contains labels
            y = kTRAM.execute(nodeID, Instruction.FF, Instruction.)00;
            if (truthLabels.contains(nodeID)) {
                kTRAM.execute(nodeID, Instruction.RH, Instruction.)00;
            } else if (y > 0) { //false-positive
                kTRAM.execute(nodeID, Instruction.RL, Instruction.XX);
            } else { // true-negative
                kTRAM.execute(nodeID, Instruction.RF, Instruction.XX);
            }
        } else {
            y = kTRAM.execute(nodeID, Instruction.FFLV,
            Instruction.RFLV);//low voltage for
minimal disturbance.
        }
        outputNodeActivations[i]= y;
    }
    return outputNodeActivations;
    }
}
```

Specialist Classifier

A specialist classifier utilizes more than one classifier to provide better accuracy at the expense of more synapses. The operation utilizes a base or 'root' classifier to perform an initial classification. If the root classifier returns more than one possible label, indicating confusion, a new prediction is generated that is the average over multiple 'specialist' classifiers, each associated with the predicted labels from the root classifier. Given a predicted set of labels generated by the root classifier, the specialist classifiers associated with the true labels and the false-positive labels are taught. That is, the specialist classifiers focus learning on their assigned labels and the patterns that are mistaken for those labels. It can be appreciated that what is shown below is one case of a larger more general set of possibilities. For example, a specialist classifier could be constructed as a decision tree and extended to arbitrary depths. What we show below contains one 'root' node that branches to a number of specialists. However, each specialist could, in turn, have child specialists and so on.

```
package org.knowm.advancements_in_ahah_computing.code;
import java.util.ArrayList;
import java.util.HashMap;
import java.util.List;
import java.util.Map;
import java.util.Set;
public class SpecialistClassifier {
    private final SimpleClassifier rootClassifier;
    private String[ ] labels;
    private Map<String,SimpleClassifier>specialistClassifiers;
    public SpecialistClassifier(String[ ] labels) {
        this.labels=labels;
        this.rootClassifier=new SimpleClassifier(labels);
        specialistClassifiers=new
        HashMap<String,SimpleClassifier>( );
        for (int i = 0; i < labels.length; i++) {
            specialistClassifiers.put(labels[i],
            new SimpleClassifier(labels));
        }
    }
    publicfloat[ ] classify(char[ ] spikes, Set<String>truthLabels) {
        float[ ] predicted = rootClassifier.classify(spikes, truthLabels);
        List<String>
allLabelsAboveZeroConfidence=
getAllLabelsAboveZeroConfidence(predicted);
        if (allLabelsAboveZeroConfidence.size( ) > 1) {//more than one node
is the predicted label. Take average over specialists.
            predicted = getSpecialistPrediction(spikes,
allLabelsAboveZeroConfidence);
        }
        if (truthLabels != null) {// teach specialists
            // truth labels
            for (String label : truthLabels) {
                specialistClassifiers.get(label).classify(spikes, truthLabels);
            }
            // false positives
            for (int i = 0; i < allLabelsAboveZeroConfidence.size( ); i++) {
                if (!truthLabels.contains
                (allLabelsAboveZeroConfidence.get(i))) {
specialistClassifiers.get
(allLabelsAboveZeroConfidence.get(i)).classify(spikes,
truthLabels);
                }
            }
        }
        return predicted;
    }
    private float[ ] getSpecialistPrediction(char[ ] spikes, List<String>
allLabelsAboveZeroConfidence) {
        float[ ] averagedSpecialistPrediction = new float[labels.length];
        for (String rootPredictedLabel : allLabelsAboveZeroConfidence) {
            float[ ]
specialistPrediction=specialistClassifiers.get
(rootPredictedLabel).classify(spikes, null);
            for (int i = 0; i < specialistPrediction.length; i++) {
                averagedSpecialistPrediction[i]+=specialistPrediction[i];
            }
        }
        for (int i = 0; i < averagedSpecialistPrediction. length; i++) {
            averagedSpecialistPrediction[i]/=
            allLabelsAboveZeroConfidence.size( );
        }
        return averagedSpecialistPrediction;
    }
    private List<1String>
    getAllLabelsAboveZeroConfidence(float[ ] labelConfidence){
        List<String>allAboveZero=new ArrayList<String>( );
        for (int i = 0; i < labelConfidence.length; i++) {
            if(labelConfidence[i]>0){
                allAboveZero.add(labels[i]);
            }
        }
        return allAboveZero;
    }
}
```

Supervised Decision Tree

Decision trees can be useful in supervised classification tasks, especially if the number of labels is large, since the total number of node evaluations is limited to the tree depth while the number of labels is limited to the number of leaf nodes. In this AHaH routine, the leaf ids are integers that encode an output spike space and supervised labels are given as spikes. Learning occurs during a traversal up the tree toward the supervised label, i.e. leaf node. For each AHaH node on the traversal up the tree, if its evaluation state magnitude is in conflict with the supervised direction, it is incremented either high or low to correct for the discrepancy.

```
import org.knowm.knowm_core.ktram.IKtRAM;
import org.knowm.knowm_core.ktram.KtRAM;
import org.knowm.knowm_core.ktram.IKtRAM.SynapticInitType;
import org.knowm.knowm_core.ktram.KtRAM.AHaHCoreType;
import org.knowm.knowm_core.ktram.IKtRAM.Instruction;
public class SupervisedDecisionTree {
    private final IKtRAM ktram= new
KtRAM(AHaHCoreType.MSS_MEM);//variable core type
    private SynapticInitType synapticInitType=
    SynapticInitType.MEDIUM;//variable
synaptic initializations;
    private final int depth;//variable tree depths.
    public SupervisedDecisionTree(int depth) {
```

-continued

```
        for (int i = 0; i < (1<<depth); i++) {
            ktram.create(i+" ", (char) ((1 << 16) - 1),
                synapticInitType);
        }
        this.depth=depth;
    }
    public char encode(char[ ] spikes) {
            int path = 0;
            int idx = 1;
            for (int i = 0; i < depth; i++) {
                if (evaluateTreeNode(" "+(path | idx),spikes)) {
                    path = path | idx;
                }
                idx = idx << 1;
            }
            return (char)path;
    }
    public char encodeAndLearn(char[ ] spikes, char label) {
      int path = 0;
      int idx = 1;
      for (int i = 0; i < depth; i++) {
          String nodeId = " "+(path | idx);
          boolean s = getBitAtIndex(label, i);// the supervised direction
          learnTreeNode(nodeId, spikes, s);
          if (s) {
             path = path | idx;
          }
          idx =idx << 1;
      }
      return (char)path;
    }
    private boolean getBitAtIndex(int n, int bitIndexFromLSB) {
            return((n >> bitIndexFromLSB) & 1) == 1;
    }
    private boolean evaluateTreeNode(String nodeId,char[ ] spikes){
           ktram.setSpikes(nodeId, spikes);
           return ktram.execute(nodeId, Instruction.FFLV,
             Instruction.RFLV) >
0;//read with low volts for minimal disturbance
    }
    private boolean learnTreeNode(String nodeId, char[ ] spikes,
      boolean s) {
            boolean y = evaluateTreeNode(nodeId,spikes);
            if (y != s) {// mistake-->learn.
               if (s) {
                  ktram.execute(nodeId, Instruction.FF,
                     Instruction.RH);
               }
               else {
                  ktram.execute(nodeId, Instruction.FF,Instruction.RL);
               }
            }
            return y;
     }
}
```

It is possible to use the supervised decision tree as an unsupervised partitioner. The process involves the following steps:

Given spike pattern S in the set of all spike patterns, encode the spike pattern to get the tree's output spike label L=encode(S). If L is not contained in set B:
  a. Add noise to pattern S to create spike pattern S' and call encodeAndLearn(S',L).
  b. Add L to set B.
  c. If the size of set B is equal to the maximum number of labels, or if a set time A has passed, clear buffer B.

Growth Classifier Initializations kT-RAM cores are limited in the total number of synapses. For operations such as classification, this can present a problem if the desired spike space over which a classification must be performed is larger than the available core spike space. In such cases the input spike space can be partitioned into multiple sub spike sets, with each set equal to or less than the available core spike space. Multiple cores can combine their output predictions by averaging the evaluation voltage for each AHaH node. An example of this occurs in the Specialist Classifiers getSpecialistPrediction( ) method. Averaging can occur from both digital or analog means, with analog averaging being more efficient but limited to neighboring kT-RAM cores. If the input spike space is known, the spike space can be partitioned in a number of ways. If the input spike space is now known, then a growth classifier can be used. In this case, each classifier is limited to a set spike space given by kT-RAM core size. When a core reaches a threshold capacity, spikes above the threshold can be sent to another core. To speed up learning, the first core's synapses are initialized LOW. To prevent disturbances in the classification as one core overflows and another begins learning, subsequent cores are initialized MEDIUM or HIGH. This causes the contribution from subsequent cores to start at zero as they gain experience.

As can be appreciated by one skilled in the art, the disclosed embodiments can be implemented in the context of a method, data processing system, or computer program product. Accordingly, embodiments may take the form of an entirely hardware embodiment, an entirely software embodiment or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object-oriented programming language (e.g., Java®, C++, etc.). The computer program code, however, for carrying out operations of particular embodiments may also be written in conventional procedural programming languages, such as the "C" programming language or in a visually oriented programming environment, such as Visual Basic.

The program code may execute entirely on the user's computer, partly on the user's computer, as a stand-alone software package, partly on the user's computer and partly on a remote computer or entirely on the remote computer. In the latter scenario, the remote computer may be connected to a user's computer through a local area network (LAN) or a wide area network (WAN), wireless data network (e.g., Wi-Fi®, Wimax®, 802.xx, and cellular networkJ or the connection may be made to an external computer via most third party supported networks (for example, through the Internet utilizing an Internet Service Provider).

The embodiments are described at least in part herein with reference to flowchart illustrations and/or block diagrams of methods, systems, and computer program products and data structures according to embodiments of the invention. It will be understood that each block of the illustrations, and combinations of blocks, can be implemented by computer program instructions. These computer program instructions may be provided to a processor of, for example, a general-purpose computer, a special-purpose computer, or other programmable data processing apparatus to produce a machine, such that the instructions/steps/operations, which execute via the processor of the computer or other programmable data processing apparatus, create means for implementing the functions/acts specified in the block or blocks.

To be clear, the disclosed embodiments can be implemented in the context of, for example, a special-purpose computer or a general-purpose computer, or other programmable data processing apparatus or system. For example, in some embodiments, a data processing apparatus or system can be implemented as a combination of a special-purpose computer and a general-purpose computer. The instructions, steps or operations discussed herein can also be implemented in the context of a physical, tangible, non-abstract computer hardware system that implements the methods and code described herein and carries out physical, non-abstract, computerized operations.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein. Such instructions can, for example, include instructions (i.e., steps or operations) such as those depicted in FIG. 4 with respect to blocks 101 to 118.

Note that a processor (also referred to as a "processing device") may perform or otherwise carry out any of the operational steps, processing steps, computational steps, method steps, or other functionality disclosed herein, including analysis, manipulation, conversion or creation of data, or other operations on data. A processor may include a general-purpose processor, a digital signal processor (DSP), an integrated circuit, a server, other programmable logic device, or any combination thereof. A processor may be a conventional processor, microprocessor, controller, microcontroller, or state machine. A processor can also refer to a chip or part of a chip (e.g., semiconductor chip). The term "processor" may refer to one, two or more processors of the same or different types. It is noted that a computer, computing device and user device, and the like, may refer to devices that include a processor, or may be equivalent to the processor itself. A processor as utilized herein may also be a digital microprocessor as discussed previously including processing devices such as CPUs, GPUs, GPGPUs, Vector Processors, Stream Processors or any other digital computing architecture that performs logical operations over bits in one or more memory spaces.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 3:
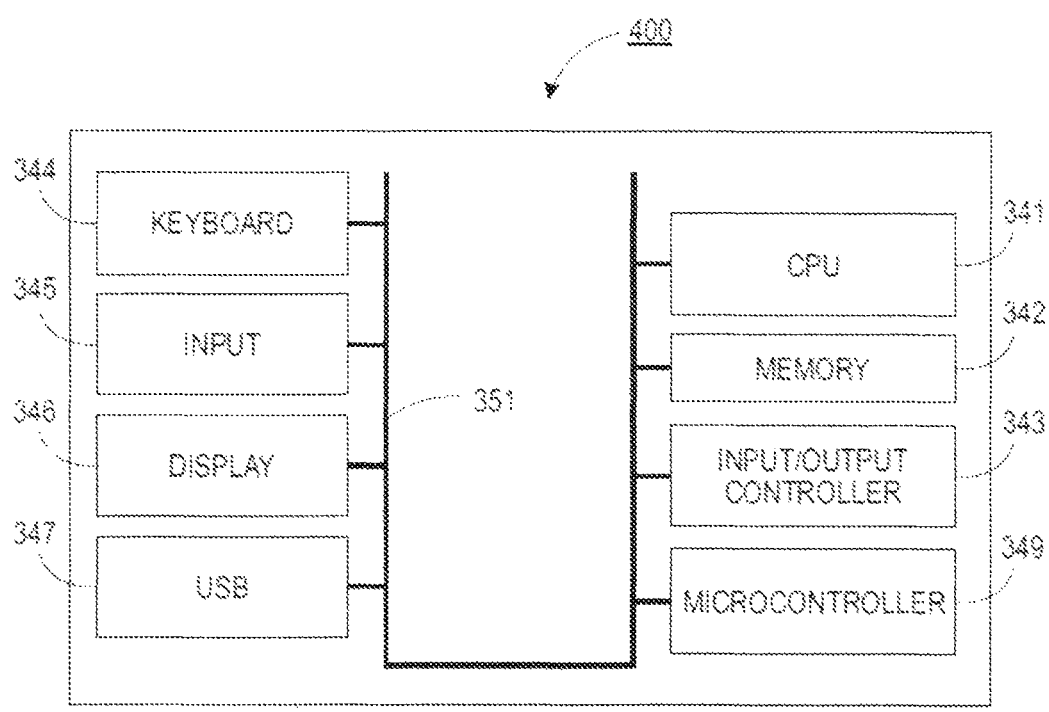
FIG. 3 illustrates a schematic view of a computer system/apparatus, in accordance with an embodiment.
Figure 4:
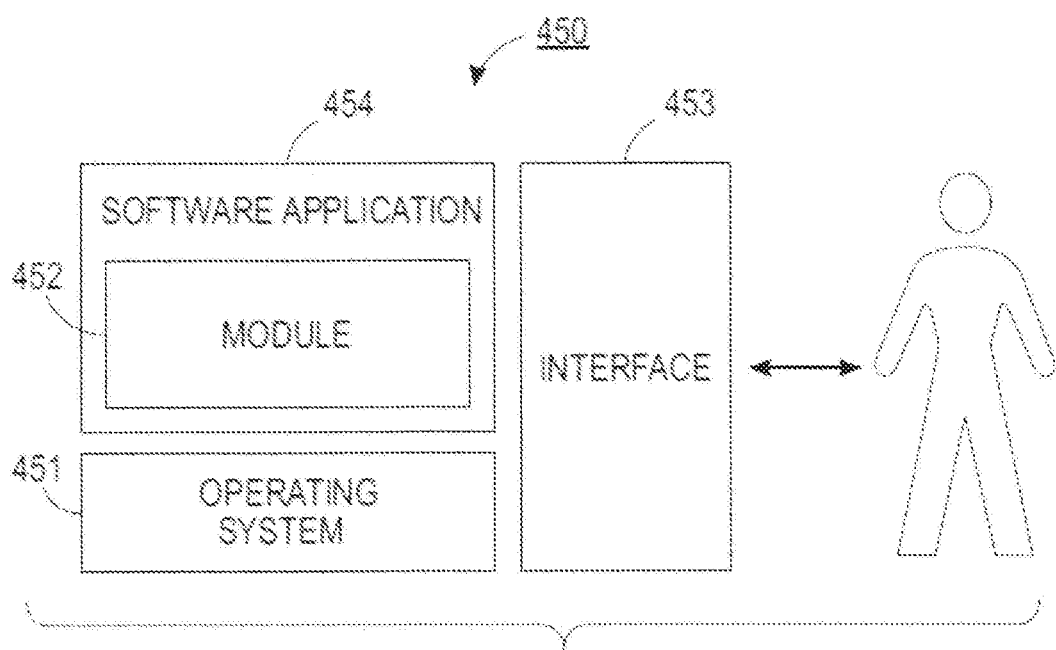
FIG. 4 illustrates a schematic view of a software system including a module, an operating system, and a user interface, in accordance with an embodiment.

FIGS. 3-4 are shown only as exemplary diagrams of data-processing environments in which example embodiments may be implemented. It should be appreciated that FIGS. 3-4 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 3, some example embodiments may be implemented in the context of a data-processing system/apparatus 400 that can include, for example, one or more processors such as a processor 341 (e.g., a CPU (Central Processing Unit) and/or other microprocessors), a memory 342, an input/output controller 343, a microcontroller 349 (which may be optional), a peripheral USB (Universal Serial Bus) connection 347, a keyboard 344 and/or another input device 345 (e.g., a pointing device, such as a mouse, track ball, pen device, etc.), a display 346 (e.g., a monitor, touch screen display, etc) and/or other peripheral connections and components. Note that various types of processors may be utilized to implement processor 341, such as a CPU, a GPU, a GPGPU, a Vector Processor, a Stream Processor or combinations thereof. In addition, although a single processor 341 is shown in FIG. 3, it can be appreciated that other processors of the same type or of different processing types may connect to the bus 341 and communicate with the various components and features of the data-processing system/apparatus 400.

As illustrated, the various components of data-processing system/apparatus 400 can communicate electronically through a system bus 351 or similar architecture. The system bus 351 may be, for example, a subsystem that transfers data between, for example, computer components within data-processing system/apparatus 400 or to and from other data-processing devices, components, computers, etc. The data-processing system/apparatus 400 may be implemented in some embodiments as, for example, a server in a client-server based network (e.g., the Internet) or in the context of a client and a server (i.e., where aspects are practiced on the client and the server).

In some example embodiments, data-processing system/apparatus 400 may be, for example, a standalone desktop computer, a laptop computer, a Smartphone, a pad computing device and so on, wherein each such device is operably connected to and/or in communication with a client-server based network or other types of networks (e.g., cellular networks, Wi-Fi®, etc).

FIG. 4 illustrates a computer software system/apparatus 450 for directing the operation of the data-processing system/apparatus 400 depicted in FIG. 3. Software application 454, stored for example in memory 342, generally includes a module 452. The computer software system/apparatus 450 further includes a kernel or operating system 451 and a shell or interface 453. One or more application programs, such as software application 454, may be "loaded" (i.e., transferred from, for example, mass storage or another memory location into the memory 342) for execution by the data-processing system/apparatus 400.

The data-processing system/apparatus 400 can receive user commands and data through the interface 453; these inputs may then be acted upon by the data-processing system/apparatus 400 in accordance with instructions from operating system 451 and/or software application 454. The interface 453 in some embodiments can serve to display results, whereupon a user may supply additional inputs or terminate a session. The software application 454 can include module(s) 452, which can, for example, implement the various instructions, steps or operations such as those discussed herein (e.g., the various software code, methods, methodologies, techniques, and systems and devices disclosed herein). For example, module 452 may implement method 300 and the instructions, steps or operations depicted at blocks 202, 204, 206, 208, 210, 210, 212, 214, 216, 218, and so on.

The following discussion is intended to provide a brief, general description of suitable computing environments in which the system and method may be implemented. Although not required, the disclosed embodiments will be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that perform particular tasks or implement particular data types and instructions. Moreover, those skilled in the art will appreciate that the disclosed method and system may be practiced with other computer system configurations, such as hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines, and an implementation, which is typically private (accessible only to that module) and which includes source code that actually implements the routines in the module. The term module may also simply refer to an application, such as a computer program designed to assist in the performance of a specific task, such as word processing, accounting, inventory management, etc. In other embodiments, a module may refer to a hardware component or a combination of hardware and software.

FIGS. 3-4 are thus intended as examples and not as architectural limitations of the disclosed embodiments. Additionally, such example embodiments are not limited to any particular application or computing or data processing environment. Instead, those skilled in the art will appreciate that the disclosed approach may be advantageously applied to a variety of systems and application software. Moreover, the disclosed embodiments can be embodied on a variety of different computing platforms, such as but not limited to Macintosh®, UNIX®, LINUX®, and so on.

It should also be appreciated that one or more of the disclosed embodiments may be implemented as a hardware device or a combination of a hardware device and software. For example, ktRAM or an AHaH computing component can be implemented in the context of a hardware integrated circuit chip (e.g. a ktRAM chip, an AHaH chip) that can communicate with other electronic components such as a processor, memory and so on. In some instances, such a hardware integrated circuit chip (e.g. a ktRAM chip, an AHaH chip) may actually replace a processor or memory.

Based on the foregoing, it can be appreciated that a number of example embodiments, preferred and alternative, are disclosed herein. Such example embodiments can be implemented to provide enhanced computer memory and processing for computing systems.

In one example embodiment, a method for unsupervised learning utilizing at least one kT-RAM, can be implemented. Such a method can include steps, instructions or operations such as performing an evaluation over a plurality of N AHaH nodes on a spike pattern using a read instruction (FF); and applying an increment high (RH) feedback instruction to a most positive AHaH node among the N AHaH nodes if an ID associated with the most positive AHaH node is not contained in a set, followed by adding a node ID to the set.

In another example embodiment, steps, operations or instructions can be implemented for applying an increment low (RL) instruction to all AHaH nodes among the plurality of N AHaH that evaluated positive but were not the most positive, contingent on the most-positive AHaH node's ID not being contained in the set. In some example embodiment, a step or operation can be implemented for removing all node ID's from the set if set size is equal to the N number of AHaH nodes. In another example embodiment, a step or operation can be processed for removing all node ID's from the set if a total number of the evaluations exceeds a threshold.

In yet another example embodiment, a method of anomaly detection utilizing kT-RAM, can be implemented. Such a method can include, for example, a step, operation or instruction for triggering an anomaly alert when a rate of change of a maximum confidence of a competitive partitioner exceeds a threshold. In another example embodiment, the competitive partitioner can comprise a binary competitive partitioner. In another example embodiment, the aforementioned kT-RAM can comprise emulated kT-RAM emulated via digital circuitry and a processor. In yet another example embodiment, the aforementioned process can include at least one of a CPU, a GPU, a FPGA or a combination thereof.

In another example embodiment, an apparatus for unsupervised learning utilizing at least one kT-RAM can be implemented. Such an apparatus can include a plurality of N AHaH nodes, wherein an evaluation is performed over the plurality of N AHaH nodes on a spike pattern using a read instruction; and an increment high (RH) feedback instruction applied to a most positive AHaH node among the N AHaH nodes if an ID associated with the most positive AHaH node is not contained in a set, followed by adding a node ID to the set.

In another example embodiment, an increment low (RL) instruction can be applied to all AHaH nodes among the plurality of N AHaH that evaluated positive but were not the most positive, contingent on the most-positive AHaH node's ID not being contained in the set. In another example embodiment, all node ID's can be removed from the set if set size is equal to the N number of AHaH nodes. In yet another example embodiment, all node ID's can be removed from the set if a total number of the evaluations exceeds a threshold.

In another example embodiment, an apparatus for anomaly detection utilizing kT-RAM can be implemented, which includes a competitive partitioner wherein an anomaly alert is triggered when a rate of change of a maximum confidence of the competitive partitioner exceeds a threshold. In still another example embodiment, the aforementioned competitive partitioner can be configured as a binary competitive partitioner. In another example embodiment, the kT-RAM can include emulated kT-RAM emulated via digital circuitry and a processor. In another example embodiment, the aforementioned processor can include one of a CPU, a GPU and a FPGA, or a combination thereof. In yet another example embodiment, the aforementioned processor can comprise a digital microprocessor. In another example embodiment, the aforementioned digital microprocessor can include at least one of a CPU, a GPU, a GPGPU, a Vector Processor, a Stream Processor or a combination thereof. In still another example embodiment, the aforementioned digital microprocessor can be configured as a digital computing architecture that performs logical operations over bits in one or more memory spaces. Note that a "Stream Processor" is a particular type of processing device that is configured to implemented stream processing, which is a programming technique that simplifies hardware and software parallel processing.

In this document, the terms "computer program medium," "computer usable medium," and "computer readable medium" can be used to generally refer to media such as, for example, the data-processing system 400 and/or the memory 342, the CPU 341, the controller 343, the microcontroller 349, and/or a main memory, a secondary memory, a removable storage drive, a hard hard disk installed in a hard disk drive, and so on. In addition, the terms "computer program medium," "computer usable medium," and "computer readable medium" can be used to refer to devices having both memory and processing capabilities in a single electronic device or single computing device. For example, some electronic integrated circuits may be implemented in the context of integrated circuit chips that possess both processing and memory capabilities.

Computer programs (also called computer control logic) can be stored in, for example, the memory 342 and/or various other memory components. Computer programs may also be received via a communication interface such as the interface 453. Such computer programs, when run, enable the computer system to perform the features of the present invention as discussed herein. In particular, the computer programs, when run, enable the processor 341 (i.e, a CPU) to perform the features of the computer system. Accordingly, such computer programs represent controllers of the computer system.

From the above description, it can be seen that the present invention provides a system, computer program product, and method for implementing the embodiments of the invention. The present invention further provides a non-transitory computer-useable storage medium for hierarchical routing and two-way information flow with structural plasticity in neural networks. The non-transitory computer-useable storage medium has a computer-readable program, wherein the program upon being processed on a computer causes the computer to implement the steps of the present invention according to the embodiments described herein. References in the claims to an element in the singular are not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. § 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method for unsupervised learning utilizing kT-RAM (Thermodynamic-Random Access Memory), said method comprising:
    performing an evaluation over a plurality of N AHaH (Anti-Hebbian and Hebbian) nodes on a spike pattern using a read instruction (FF), wherein each AHaH node among the plurality of N AHaH nodes includes a different pair of synapses comprising at least one memristor;
    applying an increment high (RH) feedback instruction to a most positive AHaH node among said N AHaH nodes if an identifier (ID) associated with said most positive AHaH node is not contained in a set, followed by adding a node ID to said set; and
    clearing a buffer when a pre-specified amount of evaluation cycles has passed, wherein the buffer allows each AHaH node about the plurality of N AHaH nodes to receive a same amount of Hebbian learning, which facilitates prevention of a single AHaH node among the plurality of N AHaH nodes from capturing a whole phase space, thereby resulting in a partition of phase space across the plurality of N AHaH nodes.

2. The method of claim 1 further comprising applying an increment low (RL) instruction to all AHaH nodes among said plurality of N AHaH nodes that evaluated positive but were not the most positive, contingent on the most-positive AHaH node's ID not being contained in said set.

3. The method of claim 1 further comprising removing all node ID's from said set if a size of the set is equal to said N number of AHaH nodes.

4. The method of claim 1 further comprising removing all node ID's from said set if a total number of said evaluations exceeds a threshold.

5. The method of claim 1 wherein said kT-RAM comprises a neuromorphic processor that implements AHaH computing.

6. An apparatus for unsupervised learning utilizing kT-RAM (Thermodynamic-Random Access Memory), said apparatus comprising:
- a plurality of N AHaH (Anti-Hebbian and Hebbian) nodes, wherein an evaluation is performed over said plurality of N AHaH nodes on a spike pattern using a read instruction), wherein each AHaH node among the plurality of N AHaH nodes includes a different pair of synapses comprising at least one memristor;
- an increment high (RH) feedback instruction applied to a most positive AHaH node among said N AHaH nodes if an identifier (ID) associated with said most positive AHaH node is not contained in a set, followed by adding a node ID to said set, thereby providing computer memory and processing for a computing system;
- a buffer that is cleared when a pre-specified amount of evaluation cycles has passed, wherein the buffer allows each AHaH node about the plurality of N AHaH nodes to receive a same amount of Hebbian learning, which facilitates prevention of a single AHaH node among the plurality of N AHaH nodes from capturing a whole phase space, thereby resulting in a partition of phase space across the plurality of N AHaH nodes.

7. The apparatus of claim 6 wherein an increment low (RL) instruction is applied to all AHaH nodes among said plurality of N AHaH nodes that evaluated positive but were not the most positive, contingent on the most-positive AHaH node's ID not being contained in said set.

8. The apparatus of claim 6 further wherein all node ID's are removed from said set if a size of the set is equal to said N number of AHaH nodes or said all node ID's are removed from said set if a total number of said evaluations exceeds a threshold.

9. The apparatus of claim 6 wherein said kT-RAM comprises emulated kT-RAM emulated via digital circuitry and a processor.

10. The apparatus of claim 9 wherein said processor comprises at least one of: a central processing unit (CPU), a graphics processing unit (GPU) and a field-programmable gate array (FPGA), or a combination thereof.

11. The apparatus of claim 9 wherein said processor comprises a graphics processing unit (GPU).

12. The apparatus of claim 9 wherein said processor comprises a field-programmable gate array (FPGA).

13. The apparatus of claim 9 wherein said processor comprises a central processing unit (CPU).

14. The apparatus of claim 9 wherein said processor comprises a digital microprocessor.

15. The apparatus of claim 14 wherein said digital microprocessor comprises at least one of a central processing unit (CPU), a graphics processing unit (GPU) GPU, a general-purpose graphics processing unit (GPGPU), a Vector Processor, a Stream Processor or a combination thereof.

16. The apparatus of claim 14 wherein said digital microprocessor comprises a digital computing architecture that performs logical operations over bits in one or more memory spaces.

17. The apparatus of claim 14 wherein said digital microprocessor comprises a Vector Processor.

18. The apparatus of claim 14 wherein said digital microprocessor comprises a Stream Processor.

* * * * *